(12) United States Patent
Wang et al.

(10) Patent No.: US 10,199,669 B2
(45) Date of Patent: Feb. 5, 2019

(54) POWER MODULATION FOR FUEL CELL POWERED DATACENTERS

(71) Applicant: Microsoft Technology Licensing, LLC, Redmond, WA (US)

(72) Inventors: Di Wang, Redmond, WA (US); Sriram Govindan, Redmond, WA (US); John J. Siegler, Carnation, WA (US); Jie Liu, Medina, WA (US); Ricardo Bianchini, Bellevue, WA (US); Eric Peterson, Woodinville, WA (US); Sean M. James, Olympia, WA (US); Bryan Kelly, Carnation, WA (US)

(73) Assignee: Micrsoft Technology Licensing, LLC, Redmond, WA (US)

( * ) Notice: Subject to any disclaimer, the term of this patent is extended or adjusted under 35 U.S.C. 154(b) by 186 days.

(21) Appl. No.: 15/143,590

(22) Filed: May 1, 2016

(65) Prior Publication Data

US 2017/0214070 A1    Jul. 27, 2017

Related U.S. Application Data

(60) Provisional application No. 62/286,875, filed on Jan. 25, 2016.

(51) Int. Cl.
*H01M 8/04* (2016.01)
*H01M 8/04664* (2016.01)
(Continued)

(52) U.S. Cl.
CPC .... *H01M 8/04865* (2013.01); *G01R 19/0092* (2013.01); *G01R 31/362* (2013.01);
(Continued)

(58) Field of Classification Search
None
See application file for complete search history.

(56) References Cited

U.S. PATENT DOCUMENTS

| 2005/0214602 A1* | 9/2005 | Sinha | H01M 8/04567 |
|---|---|---|---|
| | | | 429/431 |
| 2006/0024540 A1 | 2/2006 | LaVen et al. | |

FOREIGN PATENT DOCUMENTS

| WO | 2007125368 A1 | 11/2007 | |
|---|---|---|---|
| WO | WO-2007125368 A1 * | 11/2007 | ........ H01M 8/04231 |

OTHER PUBLICATIONS

"Second Written Opinion Issued in PCT Application No. PCT/US2017/013835", dated Aug. 3, 2017, 6 Pages.
(Continued)

*Primary Examiner* — Daniel S Gatewood
(74) *Attorney, Agent, or Firm* — Ogilvie Law Firm

(57) ABSTRACT

A fuel cell power controller tracks load current and fuel cell output voltage, and alerts on excessive fuel cell ramp rate, so another power source can supplement the fuel cell and/or the load can be reduced. A power engineering process makes efficient use of available fuel cell power by ramping up power flow rapidly when power is available, while respecting the ramp rate and other power limitations of the fuel cell and safety limitations of the load. Power flow decreases after an alert indicating an electrical output limitation of the fuel cell. Permitted power flow increases in response to a power demand increase (actual or requested) from the load in the absence of the alert. Power flow may increase or decrease in a fixed amount, a proportional amount, or per a sequence. A power controller relay may trip open on a low fuel cell output voltage or high load current.

20 Claims, 9 Drawing Sheets

(51) Int. Cl.
    G01R 31/36      (2006.01)
    G01R 19/00      (2006.01)
    G06F 1/28       (2006.01)
    H02J 7/00       (2006.01)
    H01M 8/04858    (2016.01)
    H01M 8/04537    (2016.01)
    H01M 8/04746    (2016.01)

(52) U.S. Cl.
    CPC ........... *G01R 31/3689* (2013.01); *G06F 1/28* (2013.01); *H01M 8/04544* (2013.01); *H01M 8/04597* (2013.01); *H01M 8/04604* (2013.01); *H01M 8/04664* (2013.01); *H01M 8/04753* (2013.01); *H01M 8/04925* (2013.01); *H02J 7/0063* (2013.01); *H01M 2250/10* (2013.01); *Y02B 90/14* (2013.01); *Y02P 70/56* (2015.11)

(56) References Cited

OTHER PUBLICATIONS

"International Search Report & Written Opinion Issued in PCT Application No. PCT/US2017/013835", dated Mar. 29, 2017, 11 Pages.
"International Preliminary Report on Patentability Issued in PCT Application No. PCT/US2017/013835", dated Apr. 24, 2018, 8 Pages.

\* cited by examiner

POWER MODULATION FOR FUEL CELL POWERED DATACENTERS

The present application claims priority to, and incorporates herein by reference the entirety of, United States Provisional Patent Application No. 62/286,875 filed Jan. 25, 2016.

BACKGROUND

Fuel cells convert chemical energy from a fuel into electricity, by using an electrochemical process such as a chemical reaction of positively charged hydrogen ions with oxygen or another oxidizing agent. Fuel cell operation generally depends on two supplies: a fuel supply which provides an ongoing source of fuel, and an oxygen supply which provides an ongoing source of oxygen to sustain the chemical reaction. A variety of fuels are in use or under consideration for use in fuel cells. Various oxidizers are also used or under consideration; in some cases, ambient air serves as an oxygen supply. Unlike a battery, which eventually drains and must be recharged before further use as a power source, a fuel cell can produce electricity continuously as long as the necessary fuel and oxygen are supplied.

Fuel cells are used or being considered for use in a wide variety of circumstances, alone or in combination with batteries or internal combustion engines, including for example: commercial, industrial, leisure, manufacturing, medical, military, residential, and scientific primary and backup power generation; as power sources in remote, isolated, or off-grid locations such as cabins, communication centers, communication towers, gas or oil well sites, military facilities, parks, prisons, research stations, rural locations, spacecraft, security posts, and weather stations; and in vehicles such as airplanes, all-terrain vehicles, boats, buses, cars, forklifts, recreational vehicles, spacecraft, submarines, trains, trucks, and unmanned remotely guided or autonomous vehicles.

Fuel cells have various properties that can help promote efficiency, reliability and adaptability as a power source. For example, a fuel cell can be compact and lightweight, and many fuel cells do not require any moving parts to operate. Fuel cell power generation can be environmentally much cleaner than fossil fuel power generation. Some fuel cells can use low-quality gas from landfills or waste-water treatment plants to generate power and simultaneously lower methane emissions. The theoretical energy efficiency, and in many cases the actual real-world energy efficiency, of a fuel cell can be substantially greater than the energy efficiency of fossil fuel power generation or other power sources. Fuel cells are also versatile. By consuming the oxygen within an enclosed space, a fuel cell can be used for food preservation. In some breathalyzers, the amount of voltage generated by a fuel cell is used to determine the concentration of fuel (alcohol) present in a sample. There are many other examples as well.

However, like any power source, the particular characteristics of fuel cells can be advantages or challenges in a given situation. Ongoing consumption of oxygen, for example, is an advantage when removal of oxygen from a shipping container helps preserve food that is stored in the container, but oxygen consumption is a significant challenge to the use of a fuel cell in limited-oxygen environments such as space stations and spacecraft. Accordingly, close and thoughtful attention to the characteristics of fuel cells in a given situation may reveal technical problems.

SUMMARY

Some examples are directed to the technical activity of compensating for delays that are inherent in obtaining increased power from a fuel cell. Some examples are directed to the technical activity of providing a warning as a fuel cell approaches a power output limitation or is urged to approach such a limitation by an increased demand. Some examples are directed to the technical activity of making more efficient use of the power that is available from a fuel cell. Other technical activities pertinent to teachings herein will also become apparent to those of skill in the art. It will be appreciated that a solution to problems posed by fuel cells in one operating environment may prove useful not only in the original situation but also in unexpected ways in other fuel cell usage scenarios.

Some embodiments provide a fuel cell power controller having a load current sensor which tracks a load current, a fuel cell output voltage sensor which tracks an output voltage of a fuel cell, a power controller processor with executable instructions that monitor the load current and the output voltage, and a ramp rate alert signal line which is triggered by the power controller processor when a ramp rate of the fuel cell exceeds a previously specified ramp rate threshold. The determination is based at least in part on the load current sensor values and/or the output voltage sensor values. The alert can provide a warning as a fuel cell approaches a power output limitation, indicating that the fuel cell alone may not be able to provide more power as fast as sought when power demands increase. Compensating actions may then be taken, either by using another power source such as a battery or supercapacitor to supplement the fuel cell output, or by reducing or capping the load demand on the fuel cell, or both.

Some embodiments provide a fuel cell power engineering process which makes efficient use of power that is available from a fuel cell by ramping up power flow rapidly when power is available, while still respecting the ramp rate and other power limitations of the fuel cell and the safety limitations of the load that receives the power. In some examples, a fuel cell power controller permits electrical power to flow from a fuel cell to an electrical device at a level of power. The fuel cell power controller decreases the level of electrical power flow to the electrical device in response to an alert signal which indicates an electrical output limitation of the fuel cell. The fuel cell power controller increases the level at which electrical power is permitted to flow to the electrical device in response to a power demand increase (actual or requested) from the electrical device and the absence of the alert signal. The alert may be generated, for example, when a ramp rate of the fuel cell exceeds a previously specified ramp rate threshold, when an output voltage level of the fuel cell crosses a previously specified output voltage threshold, or when a load current level of the electrical power flow to the electrical device crosses a previously specified load current threshold. Power flow may increase, or decrease, in a single fixed amount with each change, by an amount which is proportional to a previous increase or decrease of the level, or by a sequence of different amounts such as a geometric sequence or an arbitrary sequence. A relay in a power controller may be tripped open on a specified low fuel cell output voltage or high load current condition.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

DETAILED DESCRIPTION

Acronyms

Figure 1:
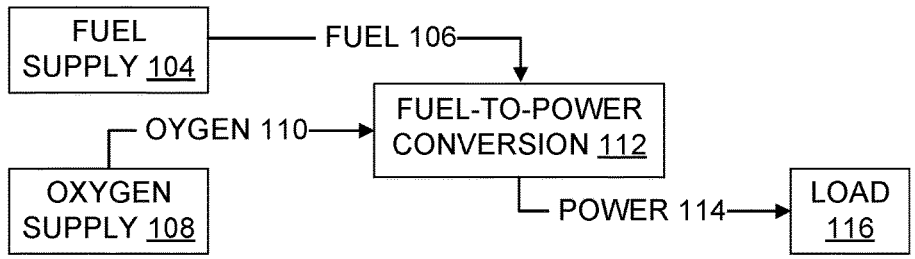
FIG. 1 is a diagram illustrating a system powered by a fuel cell in an operating environment.

Some acronyms are defined below, but others may be defined elsewhere herein or require no definition to be understood by one of skill.

AC: alternating current
ACK: acknowledgement
API: application program interface
BIOS: basic input output system
CD: compact disc
DC: direct current
DVD: digital versatile disk or digital video disc
ESD: energy storage device
RAM: random access memory
ROM: read only memory
TCP: transmission control protocol Overview Computing technologies support online commerce and enterprise applications, interactions through social media, all manner of communications through text messaging, video conferencing, various other telecommunications, and a growing Internet of Things. Much of the computation performed as an inherent part of these activities is performed using digital servers, and many of those servers are located in data centers. Cloud computing, for example, often relies on services from data centers which contain tens of thousands of servers.

Providing the electric power required to operate digital servers poses several technical challenges. How does one get the power from the place it is generated to the data center where it will be consumed? How does one minimize or at least reduce the environmental impact of generating large amounts of electric power? How does one minimize or at least reduce the capital costs and the operating costs of power generation for data centers?

Fuel cells have characteristics that make them worth investigating as part of the solution to such technical problems. As to environmental impact, fuel cells are more environmentally friendly than many more traditional means of power generation. As to getting power from the place it is generated to the data center where it will be consumed, many fuel cells can generate power near a data center, if fuel and air are available at the shared site; this transforms the problem of transmitting power into the problem of locating a data center near a fuel supply. This is sometimes an easier problem to solve, especially when ambient air can be the air supply. Colocation of data centers with fuel cells also reduces capital costs, because electric power transmission infrastructure is not needed to transmit the power for long distances to the data center. The relatively high energy efficiency of fuel cells and their ability to run on cheaper fuels can also reduce operating costs.

However, using fuel cells also creates technical challenges, because fuel cell output changes relatively slowly in response to increased demand from a load. A traditional electric power grid which has a capacity larger than the peak demand of a data center can provide increased power to the data center essentially instantaneously. Accordingly, there is no need to throttle the data center servers based on how much power is available to them at a given moment, and no need to supplement the power grid supply with power from other sources such as batteries or supercapacitors to give the servers the power they need, when they need it, to perform the computations they are tasked to perform.

In other words, a traditional electric power grid has effectively perfect load following, if it has the capacity to provide the amount of power demanded by the load. An electric power source's "load following" ability pertains to how quickly the power source can ramp up power output in response to increased demand, as opposed to how much power it can provide once it has ramped up. For present purposes, in discussing load following or power output ramp rates, we assume a power source has a capacity larger than the peak demand of the data center or rack of servers or other load in question; load following and ramp rate are concerned with how quickly a power source ramps up power output to match an increased demand for power, not with the amount of power that is demanded. In mathematical terms, with regard to load following one is concerned with the slope of a function which represents measurable power output, not with the height (magnitude) of that power output function.

Fuel cells typically perform best when the load is constant, and they have limited load following capability due to high inertia in changing fuel and air flow rates. However, data center power demand may sometimes exhibit high variations. Power demand may fluctuate because of workload fluctuations (e.g., flash crowds). Indeed, one of the touted benefits of cloud computing is the ease with which a cloud computing service provider's clients can rapidly "spin up" new virtual machine instances or other computational or storage resources as needed on demand. Power demand may also fluctuate when servers are turned on or off, e.g., to conserve power, to reboot, or to meet increased computational loads. Fuel cell power output will typically lag behind these sudden power changes. That is, many fuel cells have load following abilities which are less than effectively perfect. Depending on the situation, a fuel cell may require seconds or even minutes to ramp up to meet an increased power demand, where a traditional electric grid as described above could ramp up in under a second.

To handle the gap between power demanded and power supplied at a given time, some approaches would leverage Energy Storage Devices (ESDs). However, ESDs can be expensive, particularly when they are used only sporadically to supply power near peak demands. ESDs can also reduce reliability, if they are a single point of failure in a system. ESDs are compatible with innovative approaches presented herein, but are not required. In many situations the innovative approaches presented herein will compensate for imperfect fuel cell load tracking at a lower cost and with higher reliability than relying on ESDs would have done.

For example, one innovative approach presented here pertains to power management policies in a data center power system. A distributed server power modulation policy can be used to meet fuel cell power ramp up constraints. One approach uses an alert signal from a fuel cell pack as a feedback mechanism for adapting load power caps. In one example, the approach first applies default power caps and then gradually adapts individual power caps to improve system performance. In some examples, the distributed server power modulation policy is implemented by code on each server. An alert signal from a fuel cell pack will be sent to all servers to trigger power modulation when the power ramp up rate exceeds a threshold. Power modulation is only activated after the alert is received. Each server only checks its power and sets a cap on computational load (and hence on power demand) after an alert is received. A default conservative cap based on worst case scenario is first applied right after the alert, then a second cap is applied later by each server to increase performance. The second cap for each server is not necessarily predetermined. Each server gradually increases its second cap while no alert is present. This increase can be done using slow start and random back-off schemes similar in spirit to network packet congestion control protocols, for instance.

Another innovative approach presented here pertains to fuel cell design specifics. Fuel cell packs can include a circuit breaker based on ramp rate. An alert signal is provided to server racks or other loads if a specified power ramp up rate is violated, because this indicates that the fuel cell's load following ability is at risk of being violated, which means there is a risk the fuel cell will not be physically able to provide power as quickly as demanded, or that the fuel cell is at risk of being pushed beyond safe limits.

Other innovative approaches are also presented herein. These innovations include, for example, improvements to fuel cell technology that provide alerts when a fuel cell approaches its load following ramp rate limit, and improved power engineering processes that make more efficient use of the power available from fuel cells without exceeding ramp rate or load safety limitations. Although data centers are used as an example, and were prominent among the loads whose needs led initially to some of the innovations presented herein, the innovations presented are not limited to use in powering data centers. Some innovations may also be used in other environments where electric power demands fluctuate rapidly, e.g., as electric motors spin up, or as power is siphoned off or redirected to meet other demands. Particular fuel cell conversion technologies may also benefit from ramp rate alerts which help prevent pushing the electrochemical conversion reaction beyond safe or efficient physical limits. Unexpected variations in the fuel cell output voltage or in the current flowing to a load may also indicate problems in a power supply, problems in the fuel cell itself, or problems in the power transmission path between the fuel cell power supply and the load. Some innovations presented herein monitor fuel cell output voltage and/or the current flowing to a load, and raise alerts when they pass specified threshold levels, and can accordingly be used to help detect such problems.

The innovative approaches presented here are compatible with other approaches, but the other approaches are not themselves required by the present innovations. For instance, some innovative approaches presented here are compatible with a two-tier hierarchical power modulation policy that is formulated to meet fuel cell power ramp up constraints. This two-tier hierarchical power modulation approach combines distributed and centralized policies to ensure safety and improve application performance under limited power. A distributed server policy prevents the presence of a single point of failure while a centralized policy (e.g., chassis manager based) can use global knowledge to overwrite distributed policy caps to achieve better performance. Similarly, some innovative approaches presented here are compatible with a hybrid policy which combines energy storage and power modulations to achieve better performance and lower cost through reduced ESD capacity. This hybrid approach leverages utility curve, load prediction, fuel cell characteristics and ESD states to determine when to use which functionality (ESD supplementation vs. computational load cap).

Some Terminology

Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography. Quoted terms are being defined explicitly, but a term may also be defined implicitly without using quotation marks. Terms may be defined, either explicitly or implicitly, here in the Detailed Description and/or elsewhere in the application file.

A "fuel cell" is a device that converts chemical energy into electricity through a chemical reaction between a fuel and an oxidizing agent. Some examples of fuel include biogas, diesel fuel, gasoline, hydrogen, methane, methanol, natural gas, propane, and others noted herein or in the technical literature. Oxidizing agents include oxygen from ambient air, liquid oxygen, and others noted herein or in the technical literature. Unlike batteries, fuel cells require continuous sources of fuel and oxidizing agent to produce a continuous output of electricity. Unlike combustion engines which convert chemical energy into mechanical energy or thrust, fuel cells operate by converting chemical energy directly into electrical energy.

A fuel cell's "ramp rate" is the highest rate at which the fuel cell can safely increase its output. Ramp rate can be measured in volts per time. In some cases, a ramp rate can be determined from fuel cell manufacturer specifications. In many cases, a single (minimum) ramp rate constraint is listed in the fuel cell data sheet or other specification. A table of ramp rate constraints based on load current and fuel cell voltage can sometimes be acquired using APIs exposed by fuel cell manufacturers. Another way to determine ramp rate constraints is by profiling the fuel cell under different loads and output voltages to build a ramp rate look up table.

A "current sensor" is a device that detects electric current (AC or DC) in a wire or other electricity transmission line and produces a signal proportional to the detected current. The produced signal may be analog or digital. Current sensors can be built using, for example, fluxgates, Hall effect integrated circuit sensors, interferometers, resistors, Rowgowski coils, or transformers.

A "voltage sensor" is a device that measures voltage between two points in a circuit and produces a signal proportional to the measured voltage. Voltage sensors are used, for example, in voltmeters, potentiometers, and oscilloscopes. Since voltage equals current times resistance (Ohm's law), current sensors can be adapted for use as voltage sensors, and vice versa.

A "power supply" is a device which converts one form of electrical energy to another form of electrical energy.

A "fuel cell power controller" is a device which includes a power controller processor and at least one current or voltage sensor.

A "power controller processor" is a device which performs a power engineering process.

A "power conversion control component" is a device which includes a power controller processor and communicates with a load to perform a power engineering process on power to the load.

A "microprocessor" is a computational hardware device, often including firmware, which is capable of executing programmed instructions that process data. A microprocessor may have one or more processing cores, and may have on-board memory such as instruction or data caches. Before it is programmed, the microprocessor may be general purpose, or it may have circuitry tailored for specific uses such as graphics processing, signal processing, floating-point arithmetic processing, encryption, I/O processing, and so on. After it is programmed with instructions for a particular functionality, such as power engineering, the microprocessor is a special-purpose device tailored to that functionality.

A "memory" is a device which stores digital data in a form that is electronically accessible to a microprocessor. Memory may be volatile or non-volatile, but signals per se are not memory. No claim herein covers a signal per se, an abstract idea per se, or a natural phenomenon per se.

"Code" means microprocessor instructions, microprocessor data (which includes constants, variables, and data structures), or both instructions and data. Some of the many examples of code include applications, BIOS code, controller portions implemented in software, drivers, exception handlers, firmware, functions, hypervisors, interrupt handlers, kernels, libraries, operating systems, procedures, state machines, and virtual machines.

Although some components discussed herein may include software code, use of the term "component" herein does not mean a software component per se. "Component" as used herein is also not a nonce word. As an example, a conversion control component which includes software also includes non-software items such as sensor hardware and/or microprocessor hardware.

A "computer system" may include, for example, one or more servers, motherboards, other printed circuit boards, processing nodes, laptop computers, tablets, personal computers (portable or not), personal digital assistants, smartphones, smartwatches, smartbands, cell or mobile phones, other mobile devices having at least a microprocessor and a memory, computer-controlled manufacturing systems, many vehicles, and/or other device(s) or systems of devices having one or more microprocessors controlled at least in part by instructions. The instructions may be in the form of firmware and/or other software in memory and/or hard-coded as specialized circuitry.

"Internet of Things" means any networked collection of addressable embedded computing nodes. Such nodes are examples of computer systems as defined herein. They may also have one or more of the following characteristics: (a) no local human-readable display; (b) no local keyboard; (c) the primary source of input is sensors that track sources of non-linguistic data; (d) no local rotational disk storage, e.g., RAM chips or ROM chips provide the only local memory; (e) no CD or DVD drive; (f) embedment in a household appliance; (g) embedment in an implanted medical device; (h) embedment in a vehicle; (i) embedment in a process automation control system; or (j) a design focused on one of the following: environmental monitoring, civic infrastructure monitoring, industrial equipment monitoring, energy usage monitoring, human or animal status monitoring, or physical transportation system monitoring.

As used herein, "include" allows additional elements (i.e., includes means comprises) unless otherwise stated. "Consists of" means consists essentially of, or consists entirely of. X consists essentially of Y when the non-Y part of X, if any, can be freely altered, removed, and/or added without altering the functionality of claimed embodiments so far as a claim in question is concerned.

"Process" is sometimes used herein as a term of the computing science arts, and in that technical sense encompasses computational resource users such as coroutines, threads, tasks, interrupt handlers, application processes, kernel processes, procedures, and object methods, for example. "Process" is also used herein as a term in the power engineering art, e.g., in reference to steps which manage the generation and/or distribution of electrical power by or among devices. "Process" is also used herein as a patent law term of art, e.g., in describing a process claim as opposed to a system claim. Similarly, "method" may be used herein at times as a technical term in the computing science arts or power engineering art and also as a patent law term of art (a process). Those of skill will understand which meaning is intended in a particular instance, and will also understand that a given claimed process or method (in the patent law sense) may sometimes be implemented using one or more processes or methods (in the computing science and/or power engineering sense).

Throughout this document, use of the optional plural "(s)", "(es)", or "(ies)" means that one or more of the indicated feature is present. For example, "signal line(s)" means "one or more signal lines" or equivalently "at least one signal line".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted. Claim language intended to be interpreted as means-plus-function language, if any, will expressly recite that intention.

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as applying, capping, closing, communicating, decreasing, following, generating, increasing, monitoring, opening, permitting, programming, raising an alert, reaching, receiving, requesting, resetting, specifying, tracking (and applies, applied, caps, capped, etc.) with regard to a destination or other subject may involve intervening action by some other party, yet still be understood as being performed directly by the party of interest.

An "embodiment" herein is an example. The term "embodiment" is not interchangeable with "the invention". Embodiments may freely share or borrow aspects to create other embodiments (provided the result is operable), even if a resulting aspect combination is not explicitly described per se herein. Requiring each and every permitted combination to be explicitly described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

LIST OF REFERENCE NUMERALS

The following list is provided for convenience and in support of the drawing figures and the text of the specification and text, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. Thus, various kinds of fuel cell 302 are discussed, but they are all referred to and encompassed by reference numeral 302, to the extent they are operable. Similarly, hydrogen 106, natural gas 106, biogas 106, and gas 106 produced from coal are each examples of fuel 106, as indicated by their shared use of reference number 106. The list is:

100 fuel cell powered system
102 operating environment
104 fuel supply
106 fuel
108 oxydizer (e.g., oxygen) supply
110 oxydizer (e.g., oxygen)
112 fuel-to-power conversion component
114 electric power
116 load
200 fuel cell powered system with signals at least between the load and the fuel cell conversion control
202 one or more signals between a load and a fuel cell conversion control component
204 one or more signals between a fuel supply flow rate processor and a fuel cell conversion control component
206 fuel cell pack
208 conversion control component
302 fuel cell
304 power supply
306 load current sensor
308 output voltage sensor
310 power controller processor
312 signal lines for, e.g., alerts or programming
314 voltage sensing lines
316 current sensing line
318 power transmission lines
402 relay
404 microprocessor
406 relay coil
408 relay switch
410 fuel cell voltage monitor
412 relay drive signal line
414 load current sensing line
416 over current (high current) alert signal line
418 fuel cell low voltage alert signal line
420 microprocessor programming lines, including N lines
502 fuel cell power controller
504 microprocessor instructions
506 ramp rate alert signal line
602 memory
604 load current alert level
606 output voltage alert level
608 ramp rate threshold
610 relay activation level
702 fuel cell flow rate processor
802 digital server
804 computer system
900 data center
902 fault domain
904 chassis
906 rack
1000 vehicle
1002 vehicle or other motor, e.g., robot motor, winch motor, etc.

1004 fuel tank
1102 computational hardware
1104 computational firmware
1106 measured ramp rate
1108 measured output voltage
1110 measured load current
1112 load-related communications
1114 maximum allowed power level for load
1116 quantum by which power flow is increased
1118 quantum by which power flow is decreased
1120 maximum fuel cell load following rate
1122 relay activation level for relay trip open on high current
1124 relay activation level for relay trip open on low voltage
1126 communications with fuel cell flow rate processor
1128 data
1200 power engineering (power management) process steps
1202 permitting power to flow ata given level
1204 level at which power is presently permitted to flow
1206 receiving an alert signal about a fuel cell limitation
1208 fuel cell limitation
1210 decreasing level at which power is permitted to flow
1212 increasing level at which power is permitted to flow
1214 receiving a request to increase power flow level
1216 request to increase power flow level
1218 generating an alert signal
1220 specifying a ramp rate threshold
1222 following the load by changing the power flow level
1224 reaching a maximum safe power level for a load
1226 a sequence of values used to change power flow level
1228 programming alert levels, activation levels, thresholds, etc.
1230 capping power flow, e.g., for safe operation or to share power
1232 tracking load current
1234 tracking fuel cell output voltage
1236 activating a relay to interrupt power flow to the load
1238 closing the relay
1240 communicating with flow rate processor
1242 making a power demand request
1302 resetting power flow level, relay state, alert status
1402 monitoring fuel cell ramp rate Figures Walkthrough FIG. 1 illustrates generally a fuel cell powered system 100 in an operating environment 102. The operating environment 102 may be or may include a data center site, an educational facility, a government facility, an industrial plant, a medical facility, a military facility, a residence, a scientific research facility, a vehicle, or any other environment in which fuel cells are operable.

The system 100 includes a fuel supply 104 which supplies fuel 106 to a fuel-to-power conversion component 112. An oxidizing agent supply 108 supplies ambient air, oxygen, or another oxidizing agent 110 to the fuel-to-power conversion component 112. The component 112 uses oxygen to convert the chemical energy of the fuel into electric power 114, which is transmitted to a load 116. The load 116 may include any one or more devices that consume electric power, including for example, air conditioning units, computer systems, electroplating systems, electric motors, heaters, lasers, lighting, radio transmitters or receivers, refrigeration units, and/or many other electric-powered devices noted herein or otherwise known or hereafter developed.

Figure 2:
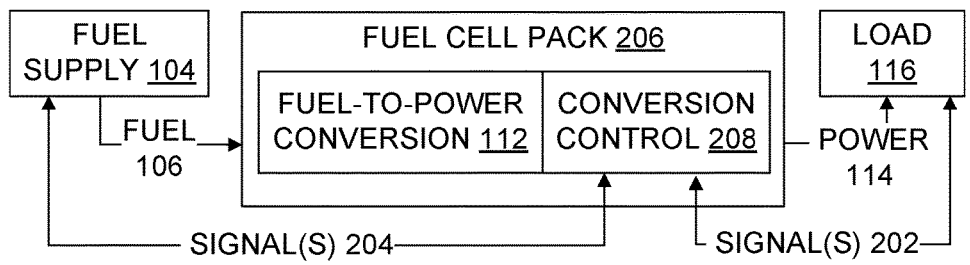
FIG. 2 is a diagram illustrating another fuel cell powered system in an operating environment.

FIG. 2 illustrates a fuel cell powered system 200 which is enhanced relative to the system 100 by the addition of a conversion control component 208 and by signal lines. The signal lines may include lines 202 carrying signals between the load 116 and the conversion control 208, lines 204 carrying signals between the fuel supply 104 and the conversion control 112, or both lines 202 and 204. The "lines" of FIG. 2 and other lines discussed herein may be physical wires, wireless connections, optical conduits, or some combination thereof, for example. For convenience and clarity of illustration, both these lines and their respective signals are each identified by the reference numerals 202 and 204, respectively (this is not ambiguous, since signals per se are not claimed). Also, for clarity of illustration oxygen supply 108 and oxygen 110 are not shown expressly in FIG. 2, but one of skill understands they are present to support the operation of fuel cell(s) in the fuel-to-power conversion component 112.

The signals 202 between the load 116 and the conversion control 208 may include, for example, a request from part of the load for a greater share of the available power, a request from the load for more power than is presently flowing, an alert to code in the load that the fuel cell ramp rate is close to being exceeded or that it has been reached, or settings from code in the load to specify alert levels or thresholds, for example. With regard to code in the load, although conversion control 208 is depicted as part of a fuel cell pack 206, in some embodiments part of the conversion control 208 component may reside in the load 116. For example, code which responds to fuel cell limitation alerts (e.g., ramp rate threshold reached, output voltage low, load current high) may execute on a server which also consumes electricity 114 produced by the fuel cell pack 206. In some embodiments, the power controller processor 310 may reside outside the fuel cell pack 206, e.g., it may be in a server 802. In some embodiments, the fuel cell 302 or fuel-to-power conversion component 112 exposes power cap levels, alert signals, and/or other values that are discussed herein, e.g., by exposing them through an API 504. This API may be used, for example, by software 504 running in a chassis manager or rack manager or on individual servers (depending on the embodiment) which implements distributed power modulation in which the chassis manager, or rack manager, or each individual server, checks its own power status and power needs and/or sets its own power cap.

The signals 204 between the fuel supply 104 and the conversion control 208 may include, for example, a request to increase the fuel flow rate into the fuel cells in order to increase the output voltage of the fuel cells, or an alert from a flow rate processor to the fuel cell pack indicating a drop in fuel supply pressure, for example.

Figure 3:
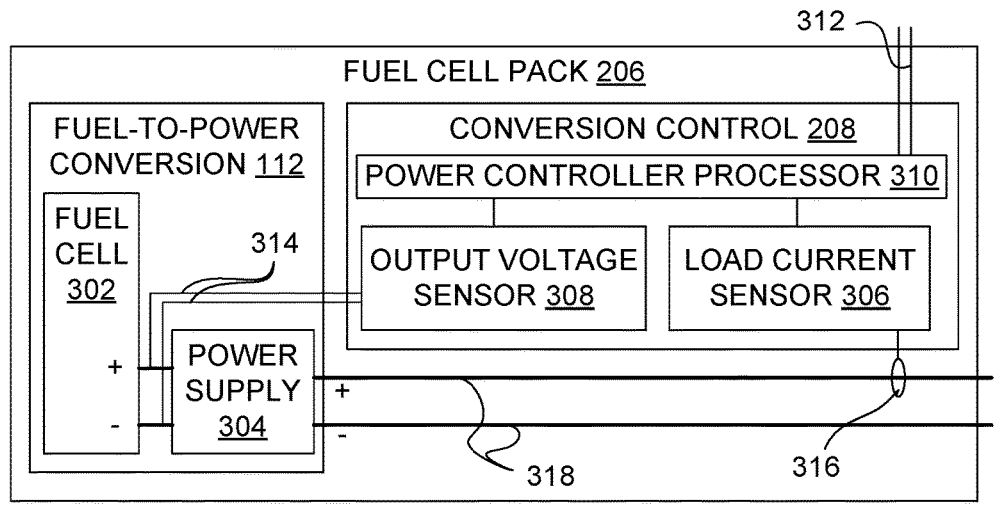
FIG. 3 is a diagram illustrating in detail a fuel cell pack of a fuel cell powered system.

FIG. 3 illustrates a fuel cell pack 206 in more detail. The fuel-to-power conversion component 112 includes at least one fuel cell 302 and at least one power supply 304. For clarity of illustration, only a single fuel cell 302 is shown in this Figure, but a given fuel cell pack 206 may include more or more fuel cells, which may be combined in series and/or in parallel to provide a specified voltage and current. Combined fuel cells are sometimes referred to as a "stack"; for convenience, fuel cell stacks are also designated by numeral 302. One or more power supplies 304 may also be combined to produce voltage and current suitable for the particular load 116; such power supply combinations are likewise referred to by numeral 304.

In the FIG. 3 example, the conversion control component 208 includes a load current sensor 306, an output voltage sensor 308, and a power controller processor 310. Lines 318 carry power 114 from the fuel-to-power conversion component 112 to the load 116. The load current sensor 306 measures load current at a location 316 and provides the measurement in digital form to the power controller processor 310. The load current measurements may be taken continuously or at intervals, and may be provided to the power controller processor 310 proactively or in response to requests (e.g., polling) from the power controller processor 310. Similarly, the output voltage sensor 308 measures voltage between locations denoted by 314 and provides the voltage measurement in digital form to the power controller processor 310. The voltage measurements may be taken continuously or at intervals, and may be provided to the power controller processor 310 proactively or in response to requests from the power controller processor 310.

Figure 4:
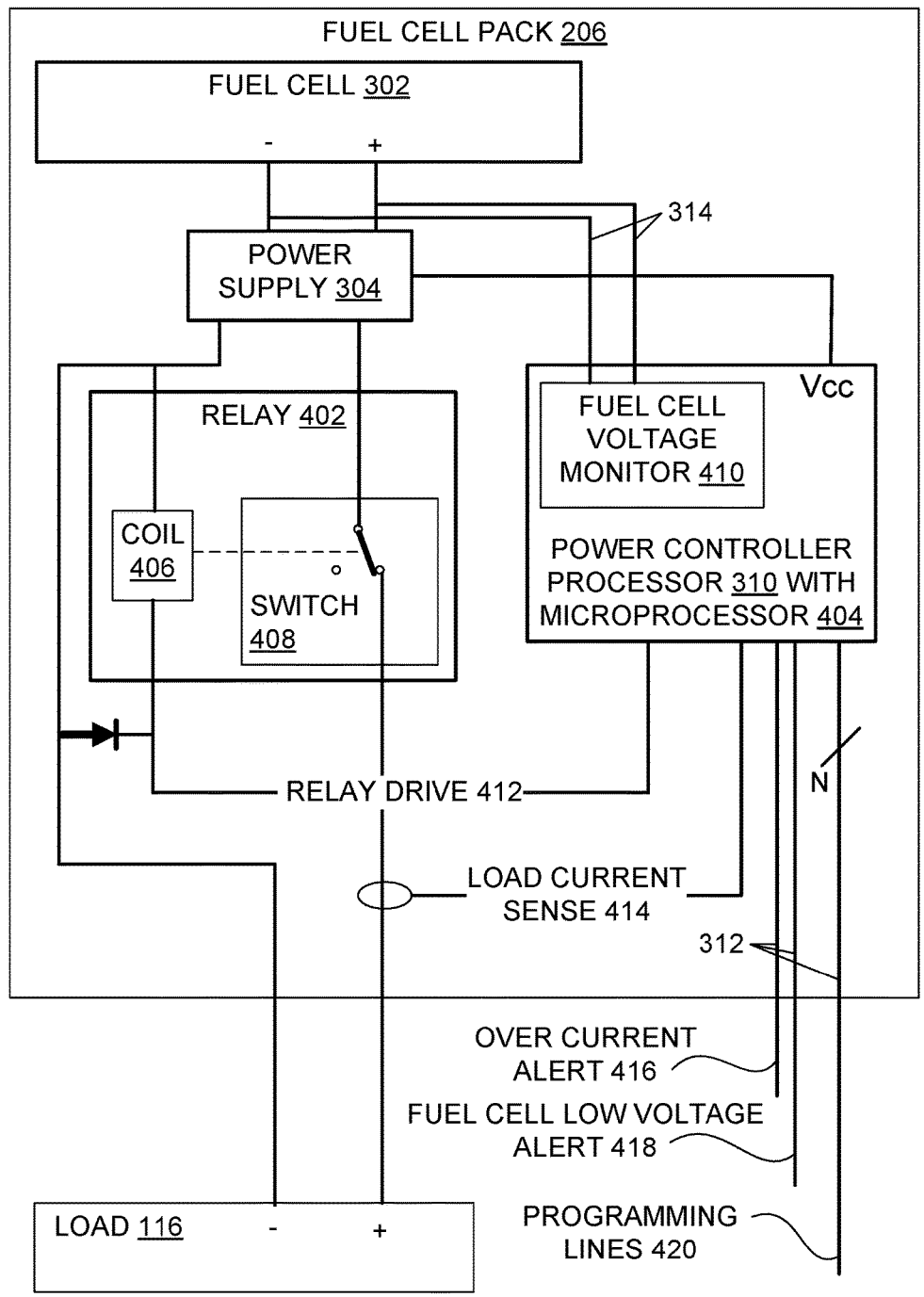
FIG. 4 is a diagram illustrating in detail another fuel cell pack of a fuel cell powered system.

FIG. 4 illustrates another fuel cell pack 206 in detail. In one contrast with the example in FIG. 3, the FIG. 4 fuel cell pack 206 includes a relay 402 located between the power supply 304 and the load 116. A coil 406 in the relay 402 can be driven over a signal line 412 to operate a relay switch 408. In the illustration, the switch 408 is closed, permitting power to flow from the power supply to the load. Actuating the coil 406 (or failing to actuate it, depending on the particular configuration) can trigger the switch 408 to open, thereby interrupting the flow of current to the load. That is, the flow of current is controlled in part by the switch 408, which is controlled by the coil 406, which is controlled by the relay drive line 412, which is controlled by the power controller processor 310.

In the example of FIG. 4, the power controller processor 310 includes a microprocessor 404 with pins for lines Vcc, 312, 314, 412, and 414. Vcc is the microprocessor power supply line. Lines 312 may include, for example, lines for an over current alert 416 signal, a fuel cell low voltage alert 418 signal, programming lines 420, and/or a ramp rate alert 506 signal line (shown in a variation in FIG. 5 but not in FIG. 4). Lines 314 connect to a fuel cell voltage monitor 410, which may be implemented using a voltage sensor 308 and code which polls the voltage sensor, for example. One or more lines 412 control the relay coil 406. Line 414 either carries a measured current, or carries current to a sensor 306 to be measured, depending on the location of the current sensor 306 (not shown in FIG. 4).

In operation, the example of FIG. 4 executes microprocessor code to monitor fuel cell output voltage and load current. Load current alert and fuel cell low voltage alert levels are programmable via programming lines 420 (a subset of lines 312). In some examples, relay 402 activation levels are also programmable. When measured load current reaches a programmed limit, alert 416 is activated. When measured fuel cell output voltage drops down to a programmed limit, alert 418 is activated. When a relay activation level is reached on high current or low voltage, in some examples, the relay switch 408 is tripped open. In some examples, the microprocessor 404 as programmed for power engineering can also measure a ramp rate on the load current and the fuel cell voltage and can issue alerts 506 and/or activate 412 the relay based on previously specified (e.g., hard-coded, dynamically set, or otherwise programmed) ramp rate limits.

One of skill will understand that the terms "limit", "level", and "threshold" are used interchangeably herein, with the understanding that each can refer to either a hard physical limitation or a precautionary value which differs from the hard physical limitation by a specified tolerance in order to provide a warning that the system is approaching the hard physical limitation, e.g., as in the maximum safe power level or the overcurrent threshold for triggering an alert 416. A "limit" or "threshold" is a fixed value, although it may be altered in some examples by programming or otherwise setting a different fixed value. A "level" may be variable and hence be measured, e.g., as in the measured output voltage level, measured load current level, or measured ramp rate level.

Figure 5:
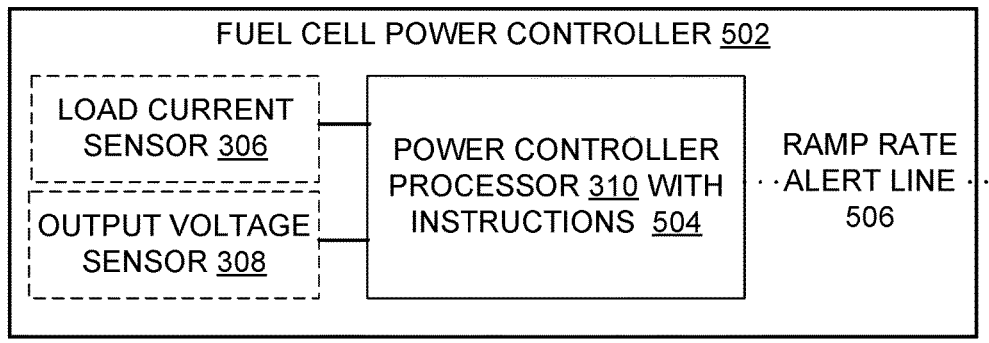
FIG. 5 is a diagram illustrating a fuel cell power controller.

FIG. 5 shows a variation of FIG. 4, in which the ramp rate alert line 506 is shown expressly as an option. In FIG. 5 and elsewhere, fuel cell power controller 502 denotes a device which includes at least a power controller processor 310 and at least one current sensor 306 or voltage sensor 308. To highlight this definition, the sensors are shown in dashed lines in FIG. 5, since one of them may be omitted in a given implementation. The specific alert lines and/or programming lines present may also vary from one example to another. FIG. 5 also expressly notes the presence of power engineering code in the form of instructions 504.

Figure 6:
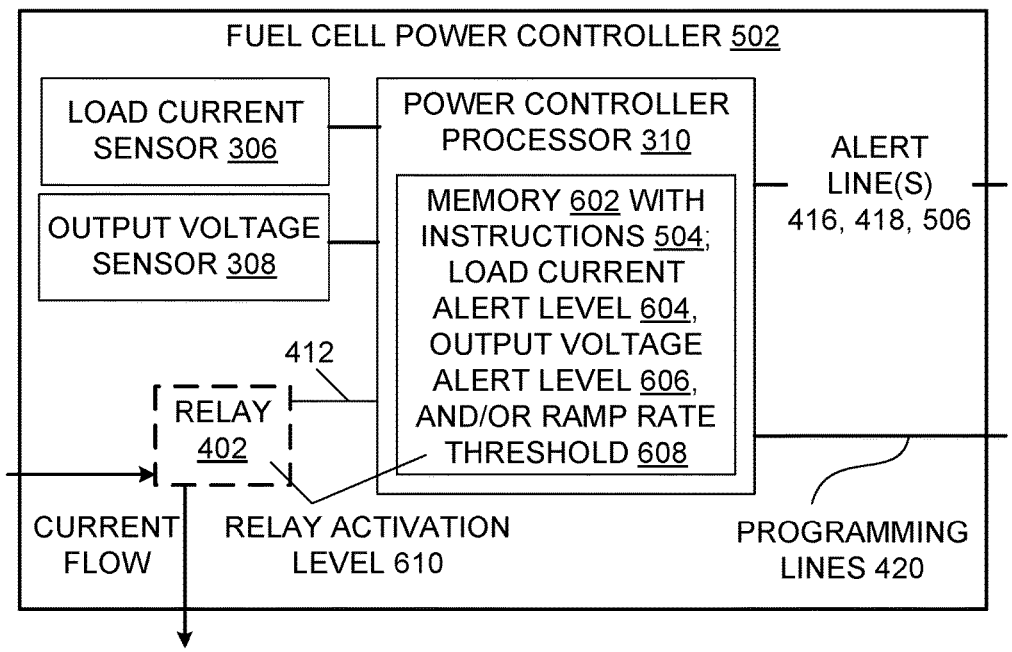
FIG. 6 is a diagram illustrating another fuel cell power controller.

FIG. 6 shows another variation, in which the relay 402 is in dashed lines to emphasize that it is present in some examples and absent from others. FIG. 6 also expressly notes the presence of digital memory 602 which contains the power engineering code 504. Those of skill will understand that memory 602 with code 504 may be present in any of the examples of FIGS. 1-15 whether it is expressly noted in the Figure or not, and that memory would be absent only when all functionality of the example is implemented in non-memory circuitry. Such an implementation would be unusual, since memory accessible to a microprocessor provides programming flexibility to alter the operation of the microprocessor without making changes in hardware, but is possible when the functionality is stable enough to make such flexibility unnecessary.

FIG. 6 also expressly notes that memory 602 may contain storage locations to hold values representing a load current alert level 604, an output voltage alert level 606, a ramp rate threshold 608, and a relay activation level 610, which are levels at which alerts are raised when the corresponding measured value matches the specified alert level or threshold.

Figure 7:
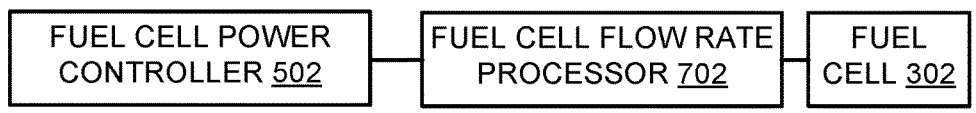
FIG. 7 is a diagram illustrating a system which includes a fuel cell power controller in communication with a fuel cell flow rate processor that controls material flow into a fuel cell.

Although many of the examples herein focus on interactions between the load 116 and the fuel cell power controller 502, in some examples the fuel-to-power conversion component 112 includes a fuel cell flow rate processor 702, as illustrated in FIG. 7. The fuel cell flow rate processor 702 may control the rate at which fuel flows into fuel cells 302, or the rate of oxygen flow into the fuel cells, or both rates. Since the power output by a fuel cell is proportional or otherwise dependent on at least one of these flow rates for some kinds of fuel cells, changing the flow rates can change the fuel cell power output. Accordingly, some embodiments include signals 204 between a power controller 502 and a fuel cell flow rate processor 702. For example, the fuel cell flow rate processor 702 may send a flow rate measurement to the power controller 502 and the power controller 502 may send a flow rate change request (or command) to the flow rate processor 702.

Figure 8:
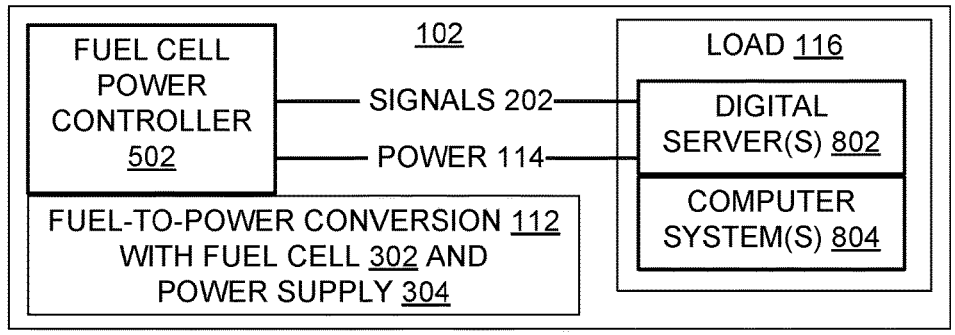
FIG. 8 is a diagram illustrating a system which includes a fuel cell power controller in an operating environment that includes one or more digital servers as devices in a load.

FIG. 8 illustrates a system 200 in which the load 116 includes one or more digital servers 802 and/or other computer systems 804. A computer system 804 may be a multiprocessor computer system, or not, and may be clustered, client-server networked, and/or peer-to-peer networked, or not. An individual server 802 is a computer system 804, and a group of cooperating computing machines is also a computer system. Human users may interact with a computer system 804 by using displays, keyboards, and other peripherals, via typed text, touch, voice, movement, computer vision, gestures, and/or other forms of I/O. A user interface may support interaction between an embodiment and one or more human users. A user interface may include a command line interface, a graphical user interface, natural user interface (gesture recognition, head and eye tracking, motion gesture detection, etc.), voice command interface, augmented reality interface, virtual reality interface, and/or other interface presentations. System administrators, developers, engineers, end-users, automated agents, scripts, playback software, and the like acting on behalf of one or more people may be users. Networking interface equipment can provide access to networks using components such as a packet-switched network interface card, a wireless transceiver, or a telephone network interface, for example, which may be present in a given computer system. However, an embodiment may also communicate through direct memory access, removable nonvolatile media, or other information storage-retrieval and/or transmission approaches, or an embodiment may operate in a computer system without communicating with other computer systems. A computer system may be deeply embedded in a system, such as a portion of the Internet of Things, such that no human user interacts directly with the computer system. Some computer systems operate in a cloud computing environment and/or a cloud storage environment in which computing services are not owned by their end user but are provided on demand.

The illustrated computer system 804 includes at least one processor core and also includes one or more computer-readable storage media, which are examples of memory. A memory 602 can be configured with instructions 504 that are executable by a processor 404; "executable" code is used in a broad sense herein to include firmware, machine code, interpretable code, bytecode, and/or code that runs on a virtual machine, for example. Media may be of different physical types. The media may be volatile memory, non-volatile memory, disks (magnetic, optical, or otherwise), fixed in place media, removable media, magnetic media, optical media, solid-state media, and/or of other types of physical durable storage media (as opposed to merely a propagated signal). In particular, a configured medium such as a portable (i.e., external) hard drive, CD, DVD, memory stick, or other removable non-volatile memory medium may become functionally a technological part of the computer system when inserted or otherwise installed, making its content accessible for interaction with and use by a microprocessor of the computer system. Some other examples of computer-readable storage media include built-in RAM, flash memory, EEPROMS or other ROMs, hard disks, and other memory storage devices. For compliance with present United States patent requirements, neither a computer-readable medium nor a computer-readable storage medium nor a computer-readable memory is a signal per se.

Although an example may be described as using software instructions executed by one or more processors in a computing device, such description is not meant to exhaust all possibilities. One of skill will understand that the same or similar functionality can also often be implemented, in whole or in part, directly in hardware logic, to provide the same or similar technical effects. Technical functionality described herein can be performed, at least in part, by one or more hardware logic components. For example, and without excluding other implementations, an embodiment may include hardware logic components such as Field-Programmable Gate Arrays, Application-Specific Integrated Circuits, Application-Specific Standard Products, System-on-a-Chip components, Complex Programmable Logic Devices, and similar electronic components. Components of an embodiment may be grouped into interacting functional modules based on their inputs, outputs, and/or their technical effects, for example.

Figure 9:
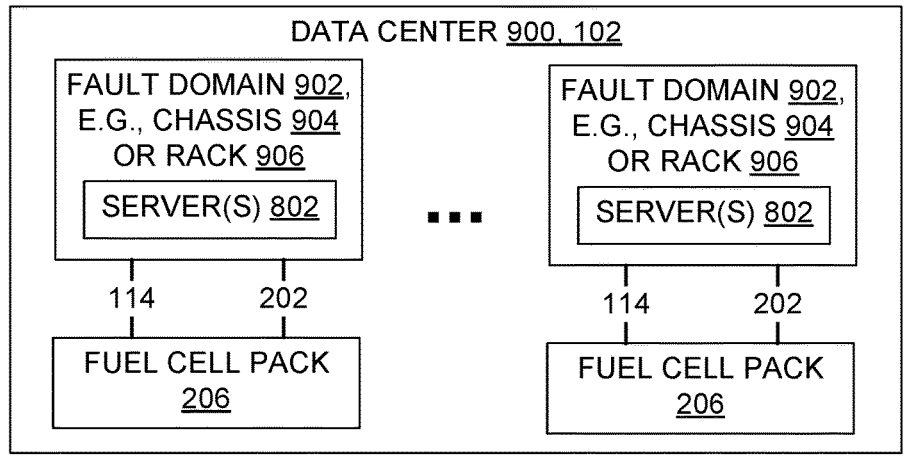
FIG. 9 is a diagram illustrating a system which includes a fuel cell power controller in an operating environment that includes multiple digital servers in a data center.

FIG. 9 illustrates a system 200 in which the operating environment 102 includes a data center 900. The illustrated data center is divided into fault domains 902. A fault domain is defined as a group of computer systems 804 (servers 802 in this example) which share a point of hardware failure, e.g., a single shared disk, a single shared switch, a single shared network or bus, or (most pertinent here) a shared source of power. A fault domain can also be defined (equivalently for present purposes) as a physical unit of failure. In some examples, each chassis 904 is a fault domain; in some, each rack 906 is a fault domain; in some, fault domains are defined by other hardware groupings. Cloud computing service providers may offer a service agreement in which instances of an application, role, virtual machine, database partition, or other software artifact are placed on at least two different fault domains 902, to improve the likelihood that the artifact will continue to be available despite a hardware failure or a low-level systemic failure that makes one of the fault domains inoperable.

In the example shown in FIG. 9, each fault domain has its own fuel cell pack 206. Thus, the impact of a failure in a fuel cell 302 or power supply 304, for instance, will be limited to the servers 802 in the single corresponding fault domain 902. The locality and independence of fuel cell packs 206 makes it easier to divide power generation capability among many fault domains than would be the case if the entire data center relied on power transmitted from a power plant, for example, or even if the entire data center relied on a single backup source of power such as a diesel generator. Use of multiple power sources in the form of fuel cell packs 206 thereby increases server 802 availability in the event of power generation problems caused by hardware failures, natural disasters, or acts of war or terrorism, for example.

Figure 10:
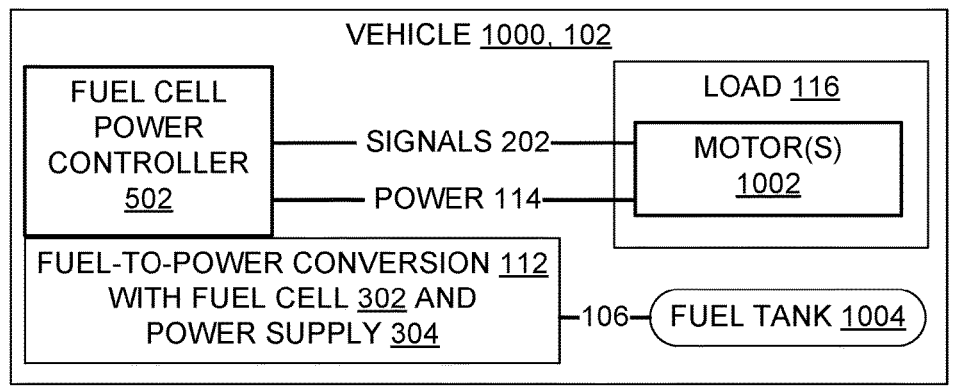
FIG. 10 is a diagram illustrating a system which includes a fuel cell power controller in an operating environment that includes a vehicle motor.

FIG. 10 illustrates a system 200 in which the operating environment 102 includes a vehicle 1000 having one or more electric motors 1002 and a fuel tank 1004. Although not expressly shown, if the fuel cell 302 requires more than ambient air as the oxidizing agent supply 108, or if the oxidizing agent supply 108 is otherwise unavailable (e.g., undersea or in outer space), then the vehicle would also include a tank of liquid oxygen or other oxidizing agent supply 108. Some examples of vehicles 1000 include airplanes, all-terrain vehicles, boats, buses, cars, forklifts, recreational vehicles, spacecraft, submarines, trains, trucks, and unmanned remotely guided or autonomous vehicles.

Figure 11:
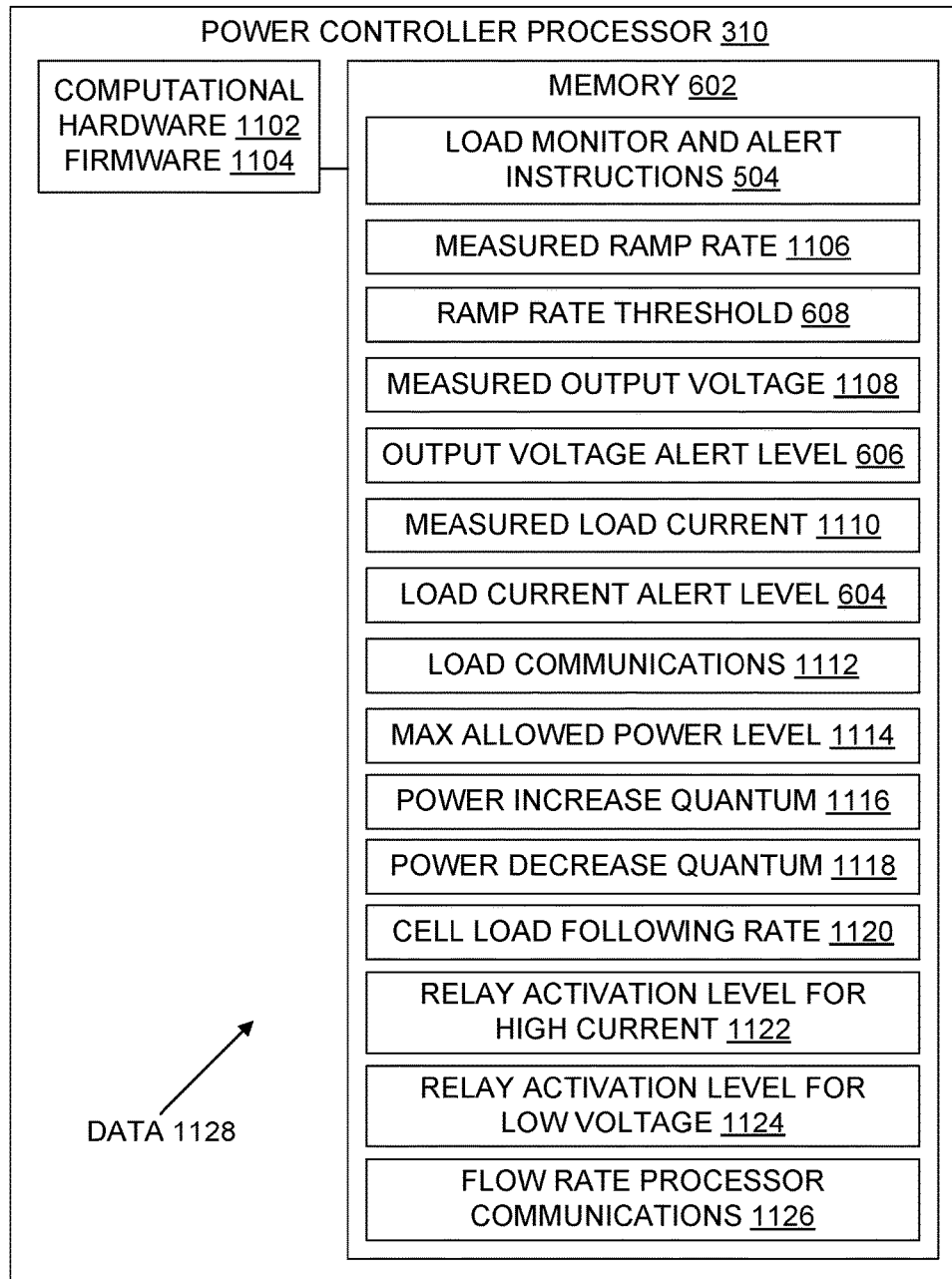
FIG. 11 is a diagram illustrating in detail a power controller processor of a fuel cell power controller.

FIG. 11 illustrates a programmable power controller processor 310, which includes computational hardware 1102 (e.g., semiconductor or quantum processor core(s)), may include firmware 1104, and includes memory 602 accessible to the computational hardware 1102. Operation of the power controller processor 310 proceeds according to instructions 504 and data programmed into the processor 310 to perform power engineering. Instructions 504 implement algorithms described herein, e.g., monitoring voltage and/or current, measuring ramp rate, raising alerts, and increasing or decreasing the amount of power permitted to flow to the load 116 or a portion thereof such as an individual server 802. Data 1128 may include a load current alert level 604, a measured load current 1110, a fuel cell output voltage alert level 606, a measured fuel cell output voltage 1108, a ramp rate threshold 608, a measured ramp rate 1106, a relay activation level 610 (e.g., a relay activation level 1122 for high load current, a relay activation level 1124 for low output voltage), load communications 1112 (e.g., requests or alerts), a maximum allowed power level 1114 (for a load 116 overall and/or for constituents of a load such as individual servers 802 or individual motors 1002), quanta 1116, 1118 for use in increasing or decreasing the amount of power permitted to flow to a load or portion thereof, a fuel cell load following rate 1120 specified by a manufacturer or determined experimentally, and other data discussed herein.

Figure 12:
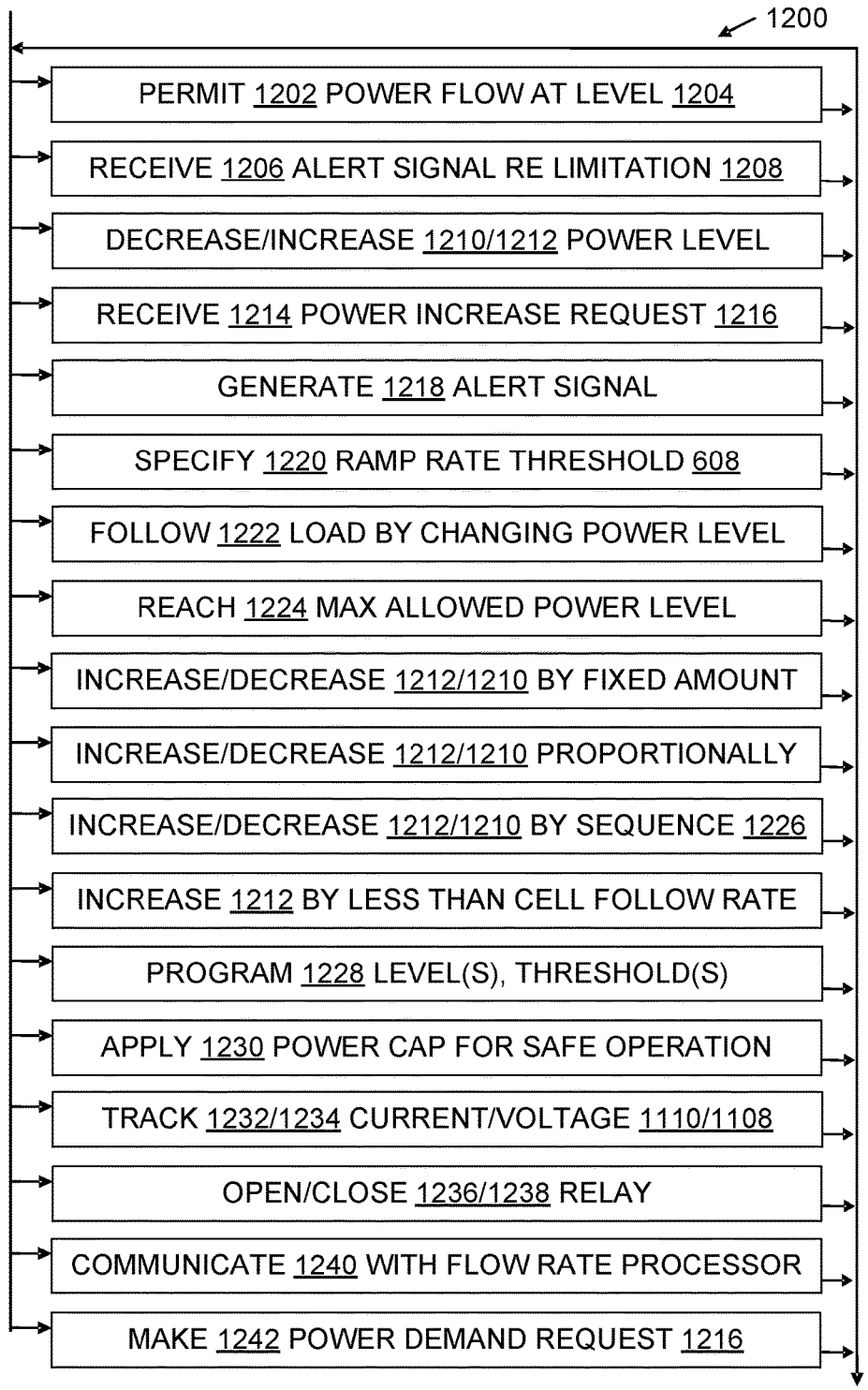
FIG. 12 is a flow chart illustrating aspects of some fuel cell power management processes, also referred to herein as power engineering processes.

FIG. 12 illustrates some process embodiments in a flowchart 1200. Technical processes shown in the Figures or otherwise disclosed may be performed in some embodiments automatically, and in some may be performed in part automatically and in part manually. In a given embodiment zero or more illustrated steps of a process may be repeated, perhaps with different inputs or data to operate on. Steps in an embodiment may also be done in a different order than the top-to-bottom order that is laid out in FIG. 12. Steps may be performed serially, in a partially overlapping manner, or fully in parallel. The order in which flowchart 1200 is traversed to indicate the steps performed during a process may vary from one performance of the process to another performance of the process. The flowchart traversal order may also vary from one process embodiment to another process embodiment. Steps may also be omitted, combined, renamed, regrouped, or otherwise depart from the illustrated flow, provided that the process performed is operable and conforms to at least one claim.

Examples are provided herein to help illustrate aspects of the technology, but the examples given within this document do not describe all possible embodiments. Embodiments are not limited to the specific approaches, arrangements, circuits, combinations, counts, features, figures, implementations, materials, names, or scenarios provided herein. A given embodiment may include additional or different technical features, mechanisms, and/or steps, for instance, and may otherwise depart from the examples provided herein.

During a permitting step 1202, an embodiment permits power 114 to flow toward a load 116 at a power level 1204. Permitting may be controlled by the fuel cell power controller 502, for example. The power level 1204 may be measured as a current, as a voltage, or both. The power level 1204 may be controlled or constrained by controlling the fuel-to-power conversion component 112, e.g., through control of fuel 106 and/or oxygen 110 flow rates into the fuel cell(s) 302. Alternatively, or in addition, the power level 1204 may be controlled or constrained by circuitry within the fuel cell power controller 502, e.g., circuitry with an adjustable output voltage regulator, dimming circuit, level-detector circuit, potentiometer, pulse-width modulation circuit, silicon-controlled rectifier, thyristor, triac, variable resistor, voltage adjuster circuit, voltage controlled voltage source circuit, voltage divider, and/or voltage regulator circuit.

During an alert receiving step 1206, a power engineering component, such as conversion control code 208 running on a server 802 or in a fuel cell pack 206, receives one or more alert signals. Some examples of alert signals include an over current alert 416, a low voltage alert 418, and a ramp rate alert 506. These alert signals pertain to a physical limitation 1208 of the fuel cell pack 206, such as a limit on how much voltage is or can be provided, a limit on how much current is or can be provided, or a limit on how quickly additional power can be provided (i.e., a ramp rate limit).

During a power level decreasing step 1210, an embodiment decreases the level 1204 of power 114 permitted 1202 to flow toward a load 116. Similarly, during a power level increasing step 1212, an embodiment increases the level 1204 of power 114 permitted 1202 to flow toward a load 116. Power level 1204 changes may be controlled by the fuel cell power controller 502, for example. Each increase may change the level 1204 by a fixed amount 1116, or may be made according to an arbitrary sequence 1226 of different amounts, or may be proportional. For instance, if the power level is 100 watts, increasing by a fixed amount may change the level to 120 watts, then to 140 watts, then to 160 watts, then to 180 watts, and so on, when the power increase quantum is 20 watts. If the power increase is sequential, then the power level values may be 100 watts, 110 watts, 125 watts, 145 watts, 170 watts, 195 watts, 220 watts, and so on, when the power increase sequence is 10 watts, 15 watts, 20 watts, 25 watts, 25 watts, 25 watts, and so on. If the power increase is proportional, then the power level values may be 100 watts, 108 watts, 124 watts, 156 watts, 220 watts, and so on, when the proportionality is implemented as multiplication by two and the initial increase is 8 watts, that is, the additions made are 8 watts, 16 watts, 32 watts, 64 watts, and so on. Power decreases 1210 may operate similarly, but with power levels 1204 decreasing toward a floor of zero instead of increasing toward a maximum allowed power level 1114 which operates as a ceiling. Different quanta and/or sequences and/or proportions may be used with increases than are used with decreases. A different mode of level changes (fixed amount vs. arbitrary sequence vs. proportional) may be used for increases than is used for decreases. The increases and/or decreases may be accomplished, for example, by code 504 executed by a microprocessor 404 to alter what level 1204 is permitted 1202, using algorithms illustrated by the examples and discussion herein.

During an alert generating step 1218, an embodiment generates one or more alerts, e.g., an over current alert 416, a low voltage alert 418, and/or a ramp rate alert 506. The alerts may be generated, for example, by code 504 executed by a microprocessor 404 based on data from current sensor 306 and/or voltage sensor 308, using algorithms illustrated by the examples and discussion herein.

During a ramp rate threshold specifying step 1220, an embodiment specifies, or receives through microprocessor programming a specification of, a ramp rate threshold 608 for a given stack of one or more fuel cells 302. The threshold may be different from the fuel cell stack's physical safe maximum ramp rate by a tolerance, so that the threshold operates as a warning that the physical limit is near. The size of such a tolerance may be balanced against the inefficiency of not taking full advantage of the fuel cell's capability. Thus, one approach is to choose the tolerance such that when the threshold 608 is reached during operation of a fuel cell pack 206, the ramp rate will continue past the threshold but not past the fuel cell stack's physical safe maximum ramp rate during the time it takes the pack 206 to command the fuel cell flow rate processor 702 to hold steady instead of continuing to increase the fuel flow rate and the time it takes the fuel cell stack to respond to the change in fuel flow rate by not increasing the ramp rate past the safe maximum. Other approaches may also be used.

During a load following step 1222, the fuel cell pack 206 follows power demand changes by changing the amount of power 114 transmitted to the load 116. Load following may be controlled by the fuel cell power controller 502, for example, as described herein. Due to the electromechanical limitations of some fuel cells 302, load following will include a time lag between the demand change at the load 116 and the output change from the fuel cell power supply 304. When there is excess power relative to the load demand, that excess power may be redirected to other fuel cell packs 206 and/or to a battery (not shown). When there is insufficient power relative to the load demand, the fuel cell power output may be supplemented from a battery or other source, or the load may be rapidly decreased, e.g., by not providing as much power to a given server 802 or given motor 1002 as was demanded.

During a max reaching step 1224, power transmitted to a load reaches a maximum safe allowed power level for the load. The power supply 304 and/or the fuel cell power controller 502 may enforce this maximum, such that the power level 1204 does not exceed it.

During a programming step 1228, one or more of the following may be programmed into the microprocessor 404 and/or memory 602 of the fuel cell power controller 502 using lines 420, for example: power engineering code 504, firmware 1104, ramp rate threshold 608, output voltage alert level 606, load current alert level 604, max allowed power level 1114, power change mode and/or quanta 1116, 1118, relay activation level(s) 1122, 1124. Programming may be accomplished using familiar microprocessor programming tools and techniques adapted for the specific code and data described herein, for instance.

During a cap applying step 1230, an embodiment applies a power cap to a load 116 or a portion of a load 116. Application of the cap prevents the load or load portion from increasing the amount of power 114 it is actually consuming, or in some cases, the amount of power it has requested or reserved from a fuel cell pack 206. For example, code 504 in a server 802 may apply a power cap by delaying or refusing creation of additional computational artifacts (e.g., virtual machines, cloud computation roles, database partition replicas, etc.) whose use of power 114 would exceed the cap. Similarly, in a robotic manufacturing facility 102, application 1230 of a power cap may prevent additional robots (not shown) from being brought into service on an assembly line.

During a current tracking step 1232, a fuel cell power controller 502 tracks load current 1110. This may be done using one or more current sensors 306 and code 504 executed by a microprocessor 404, for example. By virtue of Ohm's law, voltage sensor(s) 308 may be used instead of current sensor(s), or in addition to current sensor(s), to track 1232 current.

During a voltage tracking step 1234, a fuel cell power controller 502 tracks fuel cell voltage 1108. This may be done using one or more voltage sensors 308 and code 504 executed by a microprocessor 404, for example. By virtue of Ohm's law, current sensor(s) 306 may be used instead of voltage sensor(s), or in addition to voltage sensor(s), to track 1234 voltage.

During an opening step 1236, a relay 402 (specifically, the relay switch 408) is opened, thereby interrupting the flow of power 114 to a load 116. During a closing step 1238, the relay 402 is closed, thereby allowing power 114 to flow to the load 116. The relay 402 may be opened or closed using a drive line 412 and code 504 executed by a microprocessor 404, for example. In some embodiments, relay switching can be accomplished using one or more solid state switches, such as field effect transistors, insulated-gate bipolar transistors, and/or bipolar transistors, for example. Using a solid state switch 402 also permits current limiting on the output current of a fuel cell 302 as opposed to entirely disconnecting the fuel cell from the load 116.

During a communicating step 1240, a fuel cell power controller 502 communicates over signal line(s) 204 with a fuel cell flow rate processor 702. Communication may be controlled in the fuel cell power controller 502 by code 504 executed by a microprocessor 404, for example.

Figure 13:
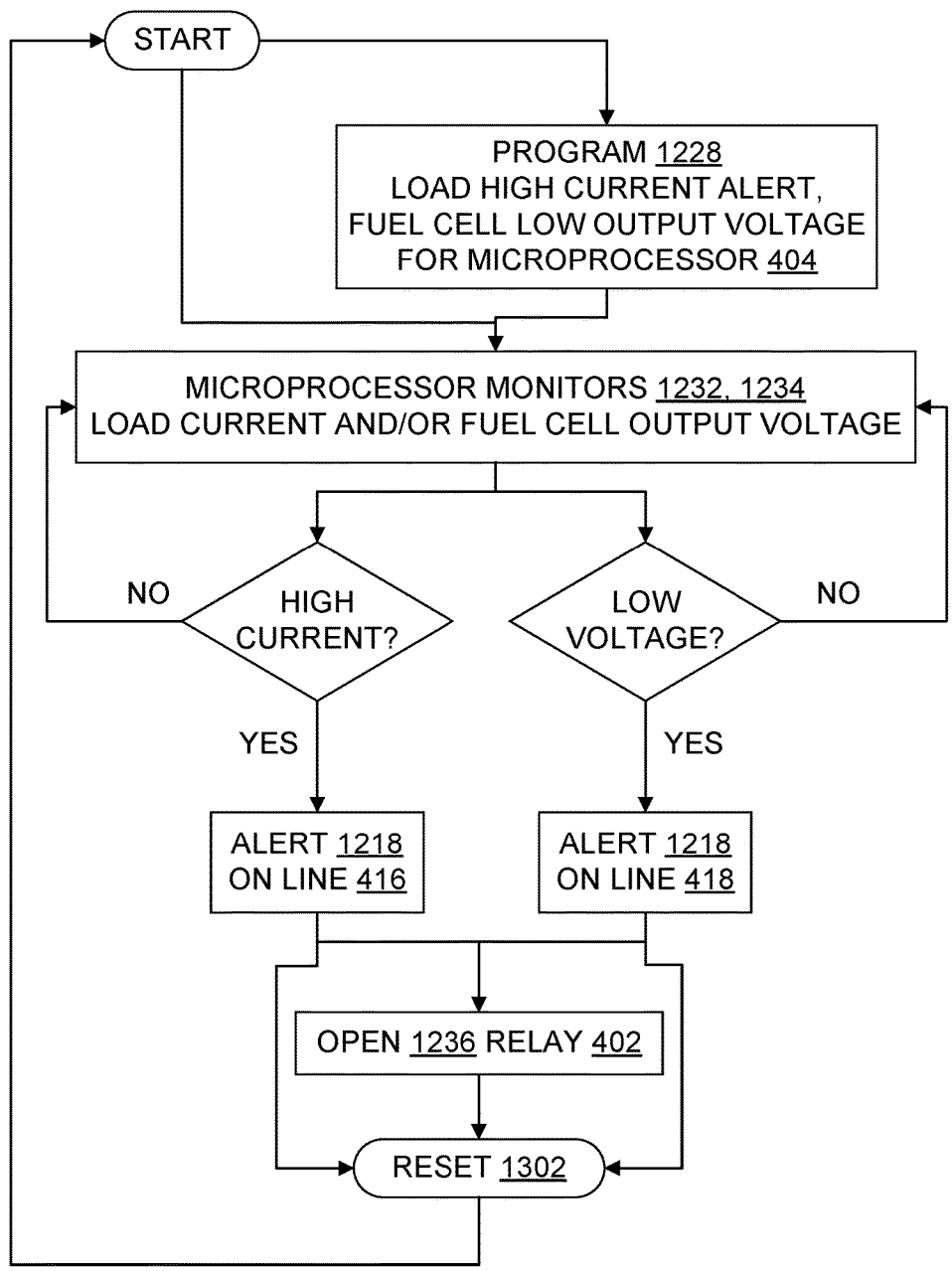
FIG. 13 is a flow chart illustrating a fuel cell power management process which provides an alert as a fuel cell approaches a power output limitation as indicated by high load current, low fuel cell output voltage, or both.

FIG. 13 illustrates a fuel cell power management process which provides an alert as a fuel cell stack 302 approaches a power output limitation as reflected by high load current 1110, low fuel cell output voltage 1108, or both. If not already present in the fuel cell power controller 502, the code 504 and alert levels 604, 606 may be programmed 1228 in. Then the code 504 execution monitors load current and/or fuel cell output voltage, e.g., by polling the corresponding sensor(s). If the value measured by a sensor exceeds the programmed alert level, the corresponding alert is raised. In some embodiments, the fuel cell power controller relay 402 is also interrupted to prevent damage to the load and/or to the fuel cell power controller. After one or more problems that led to the alert(s) are identified and resolved, the system 200 can be reset 1302, e.g., by closing the relay, lowering the alert signals, and resuming monitoring 1232 and/or 1234.

Figure 14:
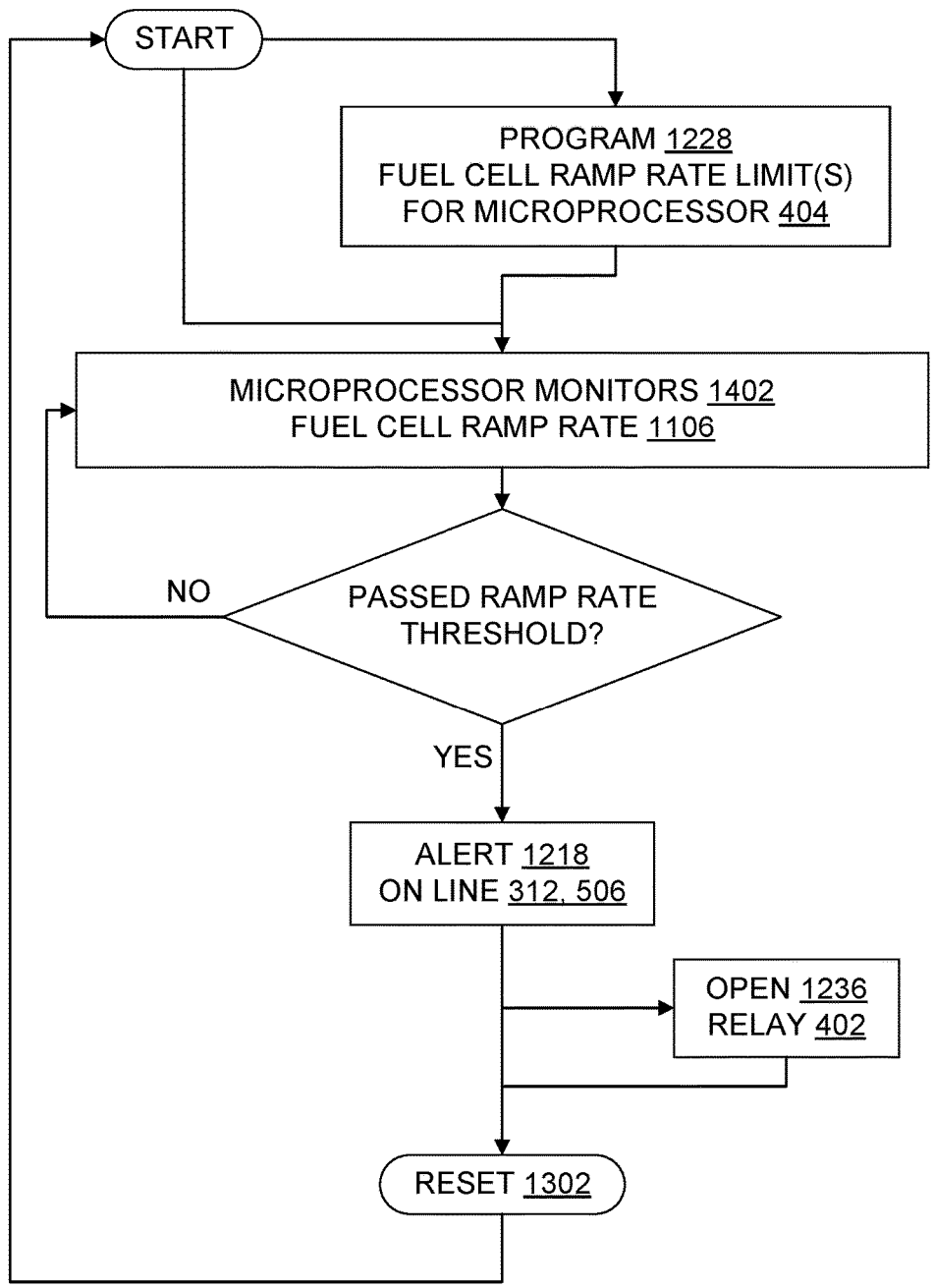
FIG. 14 is a flow chart illustrating a fuel cell power management process which provides an alert when a fuel cell reaches a fuel cell ramp rate threshold.

FIG. 14 illustrates a fuel cell power management process which provides an alert as a fuel cell stack 302 measured ramp rate approaches a power output ramp rate limitation as reflected in one or more ramp rate thresholds 608. Ramp rate is a power increase per unit of time, and can be measured by current sensor(s) and or voltage sensor(s). If not already present in the fuel cell power controller 502, the ramp rate threshold(s) may be programmed 1228 in. Then the code 504 monitors 1402 the measured fuel cell ramp rate 1106, e.g., by polling the corresponding sensor(s) to determine a change in output power, checking a timer circuit or clock circuit of processor 310 to determine a change in time between two output power measurements, and dividing the change in output power by the change in time to obtain a slope which represents the measured ramp rate. If the measured ramp rate exceeds the programmed threshold, then the ramp rate alert is raised. In some embodiments, the fuel cell power controller relay 402 is also interrupted to prevent damage to the load and/or to the fuel cell power controller. After one or more problems that led to the alert are identified and resolved, the system 200 can be reset 1302, e.g., by closing the relay, lowering the alert signal, and resuming monitoring 1402.

Figure 15:
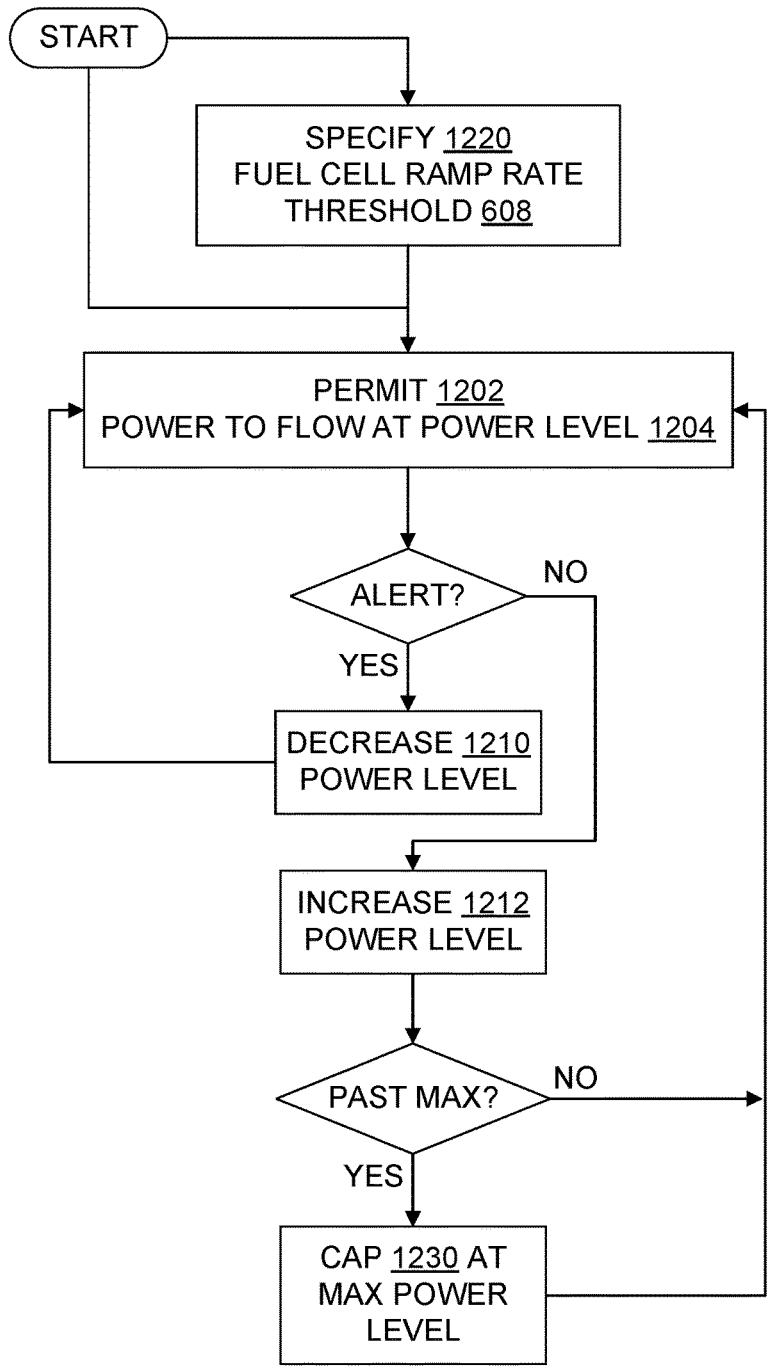
FIG. 15 is a flow chart illustrating a fuel cell power management process which adjusts power flow to make efficient use of power that is available from a fuel cell by ramping up power flow rapidly when power is available and no alert has been signaled, while still respecting power limitations of the fuel cell and safety limitations of the load that receives the power.

FIG. 15 illustrates a fuel cell power management process which maximizes or at least increases the use of whatever power 114 is available from a fuel cell pack 206 when a load 116 can make beneficial use of all such available power. If not already present in the fuel cell power controller 502, the ramp rate threshold(s) 608 may be specified 1220, e.g., by being programmed 1228 into the microprocessor. Power is initially permitted 1202 to flow at some default power level 1204. In the presence of an alert the level of power flow is decreased. In the absence of any alert, the permitted level of power flow is increased, up to a maximum at which it is capped.

Among other innovative contributions, the present inventors had the insight that power flow could be controlled in some embodiments in a manner that is reminiscent—in hindsight—to controlling packet congestion in a computer network. They realized, for example, that TCP congestion control algorithms may be lifted from their normal context and reshaped to help create algorithms for power engineering, by analogizing from the amount of electric power flowing to a load to the number of successfully transmitted network packets, and analogizing from electric power generation limitation alerts to network packet transmission errors. These are not obvious analogies to make.

In this context, one example includes increasing a server's power cap 1204 by equal increments (e.g., ⅓ of an equal share, namely, M/3 watts, where M=one server's per capita share=estimated rack power consumption divided by the number of servers in the rack). So the cap level would be M/3, 2M/3, M, 4M/3, 5M/3 . . . until an alert occurs or a max safe level 1114 for the server 802 is reached. If the alert occurs, the cap falls back to M/3 watts. If the max safe level is hit, the cap does not exceed it.

Another example includes increasing the power cap 1204 by ever-larger increments. For example, assume a typical server 802 uses 250 watts. The system 200 would not double the power cap each time it bumps up the cap, so that differs from TCP slow-start which doubles the window size with each ACK. But the power cap levels might go something like 250, 250+10, 250+10+20, 250+10+20+30, 250+10+20+30+40, etc. Or maybe 250, 250+1*25, 250+2*25, 250+4*25, 250+8*25, etc.

Some examples grow a requested power level by increasingly larger increments. For instance, the formula 250+(25*(2^N)) will do that. This is reminiscent in hindsight to the TCP congestion control slow-start algorithm, which increases the window size by doubling it each time an ACK is received. Persons who happen to be of skill in both areas (packet congestion control and power engineering) will recognize that the analogy is not exact. For instance, a device sending packets probably won't overheat or explode if the packet window size is too large, but a server 802 receiving power might overheat or even explode if the power it receives is too large. So there is a safety cap 1114 on the maximum amount of power the server can request 1112. At some point, the power requested would have exceeded that safety cap unless something prevents it. Two things that prevent it in this example are an alert signal or hitting the max safety cap. That is, if the sequence of power requests gets to the max 1114 before an alert signal 416, 418 and/or 506 stops further growth in the power level, then the last power request's increment will be capped as needed to make the total power requested not exceed the safety cap max.

One corresponding scenario would be:
Max: 1000
Initial: 250
Req1: 250+(25*1)=275 (OK)
Req2: 250+(25*2)=300 (OK)
Req3: 250+(25*4)=350 (OK)
Req4: 250+(25*8)=450 (OK)
Req5: 250+(25*16)=650 (OK)
Req6: 250+(25*32)=1050 (REJECTED but cap at 1000 is OK)

Another corresponding scenario would be:
Max: 1500
Initial: 250
Req1: 250+(25*1)=275 (OK)
Req2: 250+(25*2)=300 (OK)
Req3: 250+(25*4)=350 (OK)
Req4: 250+(25*8)=450 (OK)
Req5: 250+(25*16)=650 (OK)
Req6: 250+(25*32)=1050 (OK)
Req6: 250+(25*64)=1850 (REJECTED but cap at 1500 is OK)

Some scenarios which involve a shared fuel cell for multiple servers 802, could add an early rejection below the safety threshold. In other scenarios, the fuel-cell to server ratio is 1:1.

In many scenarios, normal operation does not exceed the fuel cell load following rate but adapts quickly to server workload increases. Because the signals 202 are electronic and the changes in load 116 occur rapidly, this is a performance requirement that cannot be satisfied manually; only automation will work. Other power engineering processes described herein are likewise too rapid to be performed manually.

Additional Examples

In some examples, a distributed server power modulation policy is used to meet a fuel cell power ramp up constraint. One such approach uses an alert signal from a fuel cell as a feedback mechanism for adapting power caps. It first applies default power caps to ensure safety and then gradually adapts individual power caps in a manner that is, in hindsight, similar to TCP congestion control to improve system performance.

In some examples, this distributed server power modulation policy is implemented on each server blade. An alert signal from a fuel cell will be sent to all blades 802 to trigger power modulation when the power ramp up rate exceeds its threshold 608. Power modulation is only activated after the alert is received. Each blade only checks its own power and sets its own cap after an alert is received. Consistent with FIG. 15, a default conservative cap based on a worst case scenario is first applied right after the alert to ensure safety, then a second cap is applied later by each blade to increase performance. The second cap for each blade is not predetermined. Each blade gradually increases 1212 its second cap while no more alert is being received, using a slow start and random back-off scheme similar in hindsight to a TCP congestion control protocol.

Some examples include a fuel cell pack 206 which includes at least one fuel cell 302 and has a circuit breaker 402 which trips when a load ramp rate of the fuel cell system exceeds a predetermined threshold. This is consistent, for example, with FIG. 14.

Some examples include a fuel cell pack 206 which includes at least one fuel cell 302 and has a circuit 502 which provides an alert signal when a load ramp rate of the fuel cell system exceeds a predetermined threshold. This is also consistent with FIG. 14. Some examples include such a fuel cell pack 206 in combination with a server 802 or server rack 906 which is connected to receive the alert signal.

Some examples include a fuel cell pack 206 which includes at least one fuel cell, has a circuit breaker which trips when a load ramp rate fuel cell system exceeds a predetermined threshold A, and also has a circuit which provides an alert signal when the load ramp rate exceeds a predetermined threshold B, wherein A and B may be the same in some cases and different in others.

Some examples include a method which includes receiving an alert signal when a fuel cell load ramp rate exceeds a predetermined threshold, and automatically taking an action to reduce a difference between a supplied power level and a target power level in response to the received alert signal. Some examples include a computer-readable storage medium (e.g., memory 602) which is not a signal per se and is configured with data and instructions to cause a processor and/or other hardware to perform such a method.

Some examples include a method wherein a power controller 502 increases the level at which electrical power is permitted to flow to a digital server and/or other load at a rate which is less than a load following rate of the fuel cell and is not less than a rate demanded by the load in response to an increase in computational and/or other work performed by the load.

Some examples include a fuel cell power controller 502 suitable for use in a data center 900. In some, the fuel cell power controller 502 includes at least one of the following sensors: a digital server load current sensor 306 which upon connection in a power system 200 provides load current sensor values that track a load current of at least one digital server 802, or a fuel cell output voltage sensor 308 which upon connection in a power system 200 provides output voltage sensor values that track an output voltage of a fuel cell 302. In some cases, the fuel cell power controller 502 also includes a power controller processor 310 with executable instructions 504 that upon execution by the power controller processor monitor at least a portion of the sensor values, and in some cases the fuel cell power controller 502 also includes a ramp rate alert signal line 506 which is triggered by the power controller processor when the executable instructions make a determination that a ramp rate of the fuel cell exceeds a previously specified ramp rate threshold 608, the determination being based at least in part on at least one of the sensor values.

In some examples the fuel cell power controller 502 also includes at least one programming line 420 connected to the power controller processor 310, which signals the executable instructions to program at least one of the following: a load current alert level, an output voltage alert level, or the ramp rate threshold.

In some examples the fuel cell power controller 502 also includes a relay 402 which trips open at a specified relay activation level, thereby interrupting a current flow path. In some cases, the relay activation level is programmable through at least one programming line connected to the power controller processor. In some cases, the relay 402 is activated by at least one of the following: a load current sensor value above a previously specified load current relay trip level, or an output voltage sensor value below a previously specified output voltage relay trip level.

In some examples the fuel cell power controller 502 is in an operable combination with an electromechanical fuel cell flow rate processor 702. Then the executable instructions 504 can send a decrease power signal 204 to the fuel cell flow rate processor to decrease fuel cell output voltage by modifying at least one flow rate of material(s) (i.e., fuel 106 and/or oxidizing agent 110) into the fuel cell 302. The decrease power signal may be sent in response to a determination that the ramp rate of the fuel cell exceeds the specified ramp rate threshold 608. In some cases, the executable instructions 504 can send an increase power signal 204 to the fuel cell flow rate processor 702 to increase fuel cell output voltage by modifying at least one flow rate of material(s) 106 and/or 110 into the fuel cell. The increase power signal may be sent when the ramp rate of the fuel cell does not exceed the specified ramp rate threshold.

In some examples the fuel cell power controller 502 is in operable combination with the fuel cell 302, e.g., the power controller 502 and fuel cell 302 are combined in a fuel cell pack 206 which may be provided, leased, sold, and/or operated as a unit.

In some examples the fuel cell 302 comprises at least one of the following: a proton exchange membrane fuel cell, a phosphoric acid fuel cell, a solid oxide fuel cell, a hydrogen-oxygen fuel cell, a molten carbonate fuel cell, or a polymer electrolyte membrane fuel cell.

In some examples the fuel cell power controller 502 is in operable combination with one or more digital servers 802 whose load current is tracked by the digital server load current sensor 306. In some, these are also in operable combination with one or more fuel cells 302.

Some examples use or include a fuel cell power engineering process which includes: a fuel cell power controller 502 permitting 1202 electrical power to flow from at least one fuel cell to an electrical device at a level of power, the fuel cell power controller decreasing 1210 the level of electrical power flow to the electrical device in response to an alert signal which indicates an electrical output limitation of the fuel cell, and the fuel cell power controller increasing 1212 the level at which electrical power is permitted to flow to the electrical device in response to a power demand increase from the electrical device and the absence of the alert signal.

In some examples, the power engineering process further includes generating 1218 the alert signal in response to at least one of the following conditions: a ramp rate of the fuel cell exceeds a previously specified ramp rate threshold, an output voltage level of the fuel cell crosses a previously specified output voltage threshold, or a load current level of the electrical power flow to the electrical device crosses a previously specified load current threshold.

In some examples, the power engineering process further includes specifying 1220 the ramp rate threshold.

In some examples, the power engineering process includes making 1212 a power demand increase as at least one of the following responses: as a response after an increase in computational work performed by at least one digital server 802, or as a response to a request 1216 made 1242 for increased power to permit a subsequent increase in computational work performed by at least one digital server.

In some examples, the power controller repeatedly increases 1212 the level 1204 at which electrical power is permitted to flow until the alert signal occurs or until a predetermined maximum power level is reached. The increases may be according to a single fixed amount, or an amount which is proportional to a previous increase of the level, or a sequence of different amounts. In some cases, the power controller subsequently decreases 1201 the level at which electrical power is permitted to flow. The decreases may be by at least one of the following: a single fixed amount, an amount which is proportional to a previous increase of the level, or a sequence of different amounts.

In some examples, the power controller increases the level 1204 at which electrical power is permitted to flow at a rate which is less than a load following rate of the fuel cell. In other cases, the following rate is exceeded.

Some examples use or provide a fuel cell power engineering process which includes: a fuel cell power controller permitting 1202 electrical power to flow from a fuel cell to a digital server at a level of power, the fuel cell power controller decreasing 1210 the level of electrical power flow to the digital server in response to an alert signal which indicates an electrical output limitation of the fuel cell, and the fuel cell power controller increasing 1212 the level at which electrical power is permitted to flow to the digital server in response to a power demand increase from the digital server and the absence of the alert signal.

In some cases, the power engineering process also includes programmatically setting 1228 at least one of the following levels for the fuel cell power controller: a load current alert level, a fuel cell voltage alert level, a relay activation level of a relay of the power controller which is tripped open on a specified high current, a relay activation level of a relay of the power controller which is tripped open on a specified low voltage, or a relay activation level of a relay of the power controller which is tripped open on either or both of the following: a specified high current, a specified low voltage.

In some examples the process also includes at least two (or in variations at least three, or at least four, etc.) of the following: generating 1218 the alert signal when a ramp rate of the fuel cell exceeds a previously specified ramp rate threshold, generating 1218 the alert signal when an output voltage level of the fuel cell crosses a previously specified output voltage threshold, generating 1218 the alert signal when a load current level of the electrical power flow to the electrical device crosses a previously specified load current threshold, applying 1230 a default power cap which promotes safe operation, tracking 1232 a load current of the digital server or other load, tracking 1234 an output voltage of the fuel cell, opening 1236 a relay to interrupt electrical power flow to the digital server, or sending 1240 a signal to a fuel cell flow rate processor of the fuel cell.

Any of these combinations of components, sensors, circuits, levels, thresholds, lines, alerts, items shown in the Figures or discussed in the text, counts, configurations and/or their functional equivalents may also be combined with any of the examples described above. A process of making or using a fuel cell pack or fuel cell controller may include any steps described herein in any subset or combination or sequence which is operable. Each variant may occur alone, or in combination with any one or more of the other variants. Each variant may occur with any of the processes and each process may be combined with any one or more of the other processes.

CONCLUSION

Although particular embodiments of tools and techniques for power engineering are expressly illustrated and described herein as processes, devices, or systems, it will be appreciated that discussion of one type of embodiment also generally extends to other embodiment types. For instance, the descriptions of processes in connection with FIGS. 12-15 also help describe fuel cell packs and fuel cell controllers, and help describe the technical effects and operation of systems and manufactures like those discussed in connection with other Figures. It does not follow that limitations from one embodiment are necessarily read into another. In particular, processes and systems are not necessarily limited to the numbers, orderings, shapes and arrangements presented as examples.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, and/or other example of the teachings herein as applied in a manner consistent with applicable law and skill in the relevant art(s)." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims and the abstract, as filed, are part of the specification.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A fuel cell power engineering process, comprising:
   a fuel cell power controller permitting electrical power to flow from a fuel cell to an electrical device at a level of power;
   the fuel cell power controller decreasing the level of electrical power flow to the electrical device in response to an alert signal, during operation of the fuel cell power controller after electrical power from the fuel cell is initially permitted to flow to the electrical device, which indicates an electrical output limitation of the fuel cell; and
   the fuel cell power controller increasing the level at which electrical power is permitted to flow to the electrical device in response to a power demand increase from the electrical device and the absence of the alert signal.

2. The process of claim 1, further comprising generating the alert signal in response to determining that a ramp rate of the fuel cell exceeds a previously specified ramp rate threshold.

3. The process of claim 2, further comprising specifying the ramp rate threshold.

4. The process of claim 1, further comprising making the power demand increase as a response after an increase in computational work performed by at least one digital server.

5. The process of claim 1, comprising the power controller repeatedly increasing the level at which electrical power is permitted to flow until the alert signal occurs or until a predetermined maximum power level is reached.

6. The process of claim 5, comprising the power controller subsequently decreasing the level at which electrical power is permitted to flow, by a single fixed amount.

7. The process of claim 5, wherein the power controller increases the level at which electrical power is permitted to flow at a rate which is less than a load following rate of the fuel cell.

8. A fuel cell power engineering process, comprising:
a fuel cell power controller permitting electrical power to flow from a fuel cell to an electrical device at a level of power;
the fuel cell power controller decreasing the level of electrical power flow to the electrical device in response to an alert signal, during operation of the fuel cell power controller after electrical power from the fuel cell is initially permitted to flow to the electrical device, which indicates an electrical output limitation of the fuel cell;
the fuel cell power controller increasing the level at which electrical power is permitted to flow to the electrical device in response to a power demand increase from the electrical device and the absence of the alert signal; and
programmatically setting at least one of the following levels for the fuel cell power controller:
a load current alert level,
a fuel cell voltage alert level,
a relay activation level of a relay of the power controller which is tripped open on a specified high current,
a relay activation level of a relay of the power controller which is tripped open on a specified low voltage, or
a relay activation level of a relay of the power controller which is tripped open on either or both of the following: a specified high current, a specified low voltage.

9. The process of claim 8, further comprising at least two of the following:
generating the alert signal when a ramp rate of the fuel cell exceeds a previously specified ramp rate threshold;
generating the alert signal when an output voltage level of the fuel cell crosses a previously specified output voltage threshold;
generating the alert signal when a load current level of the electrical power flow to the electrical device crosses a previously specified load current threshold;
applying a default power cap which promotes safe operation;
tracking a load current of a digital server;
tracking an output voltage of the fuel cell;
opening a relay, thereby interrupting electrical power flow to the digital server; or
sending a signal to a fuel cell flow rate processor of the fuel cell.

10. The process of claim 1, further comprising generating the alert signal in response to determining that an output voltage level of the fuel cell crosses a previously specified output voltage threshold.

11. The process of claim 1, further comprising generating the alert signal in response to determining that a load current level of the electrical power flow to the electrical device crosses a previously specified load current threshold.

12. The process of claim 1, further comprising making the power demand increase as a response to a request for increased power to permit a subsequent increase in computational work performed by at least one digital server.

13. The process of claim 5, comprising the power controller subsequently decreasing the level at which electrical power is permitted to flow, by an amount which is proportional to a previous increase of the level.

14. The process of claim 5, comprising the power controller subsequently decreasing the level at which electrical power is permitted to flow, by a sequence of different amounts.

15. The process of claim 8, further comprising generating the alert signal when a ramp rate of the fuel cell exceeds a previously specified ramp rate threshold.

16. The process of claim 8, further comprising generating the alert signal when an output voltage level of the fuel cell crosses a previously specified output voltage threshold.

17. The process of claim 8, further comprising generating the alert signal when a load current level of the electrical power flow to the electrical device crosses a previously specified load current threshold.

18. The process of claim 8, further comprising tracking at least one of the following: a load current of a digital server fed by the fuel cell, an output voltage of the fuel cell.

19. The process of claim 8, further comprising opening a relay, thereby interrupting electrical power flow to a digital server fed by the fuel cell.

20. A fuel cell power controller comprising a power controller processor and an alert signal line in operable communication with the processor, the fuel cell power controller configured to perform an engineering process, the process comprising:
the fuel cell power controller permitting electrical power to flow from a fuel cell to an electrical device at a level of power;
the fuel cell power controller decreasing the level of electrical power flow to the electrical device in response to an alert signal which indicates an electrical output limitation of the fuel cell; and
the fuel cell power controller increasing the level at which electrical power is permitted to flow to the electrical device in response to a power demand increase from the electrical device and the absence of the alert signal.

* * * * *